(12) United States Patent
Kwak et al.

(10) Patent No.: US 10,980,120 B2
(45) Date of Patent: Apr. 13, 2021

(54) COMPACT PRINTED CIRCUIT BOARD

(71) Applicant: Rain Bird Corporation, Azusa, CA (US)

(72) Inventors: Chong Wang Kwak, Tucson, AZ (US); John James Wlassich, Pasadena, CA (US)

(73) Assignee: Rain Bird Corporation, Azusa, CA (US)

( * ) Notice: Subject to any disclaimer, the term of this patent is extended or adjusted under 35 U.S.C. 154(b) by 0 days.

(21) Appl. No.: 16/007,007

(22) Filed: Jun. 13, 2018

(65) Prior Publication Data

US 2018/0368261 A1     Dec. 20, 2018

Related U.S. Application Data

(60) Provisional application No. 62/519,985, filed on Jun. 15, 2017.

(51) Int. Cl.
*H05K 1/14* (2006.01)
*H01F 7/06* (2006.01)
*F16K 31/42* (2006.01)

(52) U.S. Cl.
CPC ............ *H05K 1/148* (2013.01); *F16K 31/42* (2013.01); *H01F 7/06* (2013.01); *H05K 1/144* (2013.01); *H05K 2201/042* (2013.01)

(58) Field of Classification Search
CPC .. H05K 1/148; H05K 1/144; H05K 2201/042; F16K 31/42; H01F 7/06
See application file for complete search history.

(56) References Cited

U.S. PATENT DOCUMENTS 211,820 A    1/1879   White
306,972 A   10/1884   Stiles
(Continued)

FOREIGN PATENT DOCUMENTS

CN      85205374 U    11/1986
CN       1345531       4/2002
(Continued)

OTHER PUBLICATIONS

Andwin Circuits Co., Limited, Andwin Circuits PCB Expert, Rigid Flex PCB (Printed Circuit Boards), copyright 2015, [online]. Retrieved from the Internet: <URL: http://www.andwinpcb.com/rigid-flex-pcb/>, 5 pages. Publicly available before Jun. 13, 2018.
(Continued)

*Primary Examiner* — Umashankar Venkatesan
(74) *Attorney, Agent, or Firm* — Fitch, Even, Tabin & Flannery, LLP

(57) ABSTRACT

There is provided a compact printed circuit board. The compact printed circuit board has a flexible rigid printed circuit board connector with a rigid printed circuit board attached at each end of the connector. The printed circuit board can then be folded into a compact, overlying configuration. As such, the compact printed circuit board has a smaller footprint than a standard rectangular printed circuit board, while maintaining the same or having increased micro-electronics and functionality. The compact configuration allows the folded printed circuit board to be integrated with a solenoid used in the control of a valve or sprinkler of an irrigation system.

32 Claims, 8 Drawing Sheets

(56) References Cited

U.S. PATENT DOCUMENTS

| | | | |
|---|---|---|---|
| 674,917 A | 5/1901 | Halbert | |
| 766,420 A | 8/1904 | Galley | |
| 1,001,593 A | 8/1911 | Hertzberg | |
| 1,566,375 A | 12/1925 | Coatalen | |
| 1,764,712 A | 6/1930 | Brackett | |
| 2,259,990 A | 10/1941 | Baumann | |
| 2,342,347 A | 2/1944 | Jacobsen | |
| 2,477,587 A | 8/1949 | Doutt | |
| 2,504,057 A | 4/1950 | Trefil | |
| 2,638,109 A | 5/1953 | Wahlmark | |
| 2,740,097 A * | 3/1956 | Edelman | H01R 12/52 439/75 |
| 2,746,471 A | 5/1956 | Cobb | |
| 2,860,015 A | 11/1958 | Matterson | |
| 2,940,474 A | 6/1960 | Webster | |
| 2,953,248 A | 9/1960 | Troland | |
| 3,082,359 A | 3/1963 | Seybold | |
| 3,203,447 A | 8/1965 | Bremner | |
| 3,262,027 A | 7/1966 | Churchill | |
| 3,279,749 A | 10/1966 | Fleckenstein | |
| 3,339,583 A | 9/1967 | Fleckenstein | |
| 3,379,214 A | 4/1968 | Weinberg | |
| 3,411,745 A | 11/1968 | Austin, Jr. | |
| 3,420,492 A | 1/1969 | Ray | |
| 3,448,960 A | 6/1969 | Medley | |
| 3,458,769 A | 7/1969 | Stampfli | |
| 3,477,693 A | 11/1969 | Bezanis | |
| 3,481,578 A | 12/1969 | Baldi | |
| 3,504,315 A | 3/1970 | Stanwell | |
| 3,511,472 A | 5/1970 | Zimmerman | |
| 3,547,154 A | 12/1970 | Benham | |
| 3,598,145 A | 8/1971 | Wolfson | |
| 3,598,360 A | 8/1971 | Merriner | |
| 3,633,869 A | 1/1972 | Lehmann | |
| 3,729,710 A | 4/1973 | Sherwin | |
| 3,743,898 A | 7/1973 | Sturman | |
| 3,747,620 A | 7/1973 | Kah, Jr. | |
| 3,757,263 A | 9/1973 | Merriner | |
| 3,941,348 A | 3/1976 | Mott | |
| 3,977,436 A | 8/1976 | Lamer | |
| 3,989,066 A | 11/1976 | Sturman | |
| 4,004,258 A | 1/1977 | Arnold | |
| 4,007,458 A | 2/1977 | Hollabaugh | |
| 4,010,390 A | 3/1977 | Stampfli | |
| 4,022,244 A | 5/1977 | Oman | |
| 4,029,295 A | 6/1977 | Wassmer | |
| D246,377 S | 11/1977 | Pansini | |
| 4,056,255 A | 11/1977 | Lace | |
| 4,065,722 A | 12/1977 | Francis | |
| 4,074,699 A | 2/1978 | Stampfli | |
| 4,082,116 A | 4/1978 | Stampfli | |
| 4,099,701 A | 7/1978 | Berger | |
| 4,111,230 A | 9/1978 | Stampfli | |
| 4,114,184 A | 9/1978 | Stampfli | |
| 4,121,114 A | 10/1978 | Ruggles | |
| 4,131,882 A | 12/1978 | Hollabaugh | |
| 4,165,532 A | 8/1979 | Kendall | |
| 4,176,395 A | 11/1979 | Evelyn-Veere | |
| 4,241,375 A | 12/1980 | Ruggles | |
| 4,251,053 A | 2/1981 | Wurzer | |
| 4,257,573 A | 3/1981 | Stampfli | |
| D266,863 S | 11/1982 | Mason | |
| 4,383,234 A | 5/1983 | Yatsushiro | |
| 4,419,643 A | 12/1983 | Ojima | |
| 4,423,484 A | 12/1983 | Hamilton | |
| 4,445,788 A | 5/1984 | Twersky | |
| 4,470,030 A | 9/1984 | Myers | |
| 4,506,701 A | 3/1985 | Masaki | |
| 4,535,401 A | 8/1985 | Penn | |
| 4,537,387 A | 8/1985 | Danby | |
| 4,540,154 A | 9/1985 | Kolchinsky | |
| 4,548,225 A | 10/1985 | Busalacchi | |
| 4,556,864 A | 12/1985 | Roy | |
| 4,562,506 A | 12/1985 | Moran | |
| 4,590,962 A | 5/1986 | Tespa | |
| 4,596,266 A | 6/1986 | Kinghorn | |
| 4,637,548 A | 1/1987 | Ray | |
| 4,643,393 A | 2/1987 | Kosugi | |
| 4,645,882 A | 2/1987 | Nakayama | |
| 4,662,399 A | 5/1987 | Buchner | |
| 4,679,767 A | 7/1987 | Vollmer | |
| 4,697,786 A | 10/1987 | Kennedy | |
| 4,716,490 A | 12/1987 | Alexanian | |
| 4,718,454 A | 1/1988 | Appleby | |
| 4,720,078 A | 1/1988 | Nakamura | |
| D294,964 S | 3/1988 | Mendenhall | |
| 4,733,212 A | 3/1988 | Goodwin | |
| 4,751,487 A | 6/1988 | Green, Jr. | |
| 4,758,811 A | 7/1988 | Slavin | |
| D297,929 S | 10/1988 | Hughes | |
| 4,777,556 A | 10/1988 | Imran | |
| 4,781,213 A | 11/1988 | Kilayko | |
| 4,790,351 A | 12/1988 | Kervagoret | |
| 4,794,890 A | 1/1989 | Richeson, Jr. | |
| 4,801,910 A | 1/1989 | Ayers | |
| 4,811,221 A | 3/1989 | Sturman | |
| 4,829,947 A | 5/1989 | Lequesne | |
| 4,852,802 A | 8/1989 | Iggulden | |
| 4,893,645 A | 1/1990 | Augustinas | |
| 4,954,799 A | 9/1990 | Kumar | |
| 4,967,996 A | 11/1990 | Sonoda | |
| 4,994,776 A | 2/1991 | Juncu | |
| 5,008,664 A | 4/1991 | More | |
| 5,010,911 A | 4/1991 | Grant | |
| 5,021,939 A | 6/1991 | Pulgiese | |
| 5,023,787 A | 6/1991 | Evelyn-Veere | |
| 5,048,755 A | 9/1991 | Dodds | |
| 5,050,800 A | 9/1991 | Lamar | |
| 5,064,166 A | 11/1991 | Schechter | |
| 5,067,688 A | 11/1991 | Tanimoto | |
| 5,071,267 A | 12/1991 | Aldefeld | |
| 5,079,667 A | 1/1992 | Kasano | |
| 5,085,402 A | 2/1992 | O'Dell | |
| 5,097,861 A | 3/1992 | Hopkins | |
| 5,100,056 A | 3/1992 | Theodorsen | |
| 5,125,432 A | 6/1992 | Fujii | |
| 5,139,226 A | 8/1992 | Baldwin | |
| 5,145,148 A | 9/1992 | Laurent | |
| 5,153,550 A | 10/1992 | Sugiura | |
| 5,186,433 A | 2/1993 | Pausch | |
| 5,199,462 A | 4/1993 | Baker | |
| 5,213,303 A | 5/1993 | Walker | |
| 5,229,649 A | 7/1993 | Nielsen | |
| 5,229,937 A | 7/1993 | Evelyn-Veere | |
| 5,251,153 A | 10/1993 | Nielsen | |
| 5,311,162 A | 5/1994 | Sjoquist | |
| 5,333,785 A | 8/1994 | Dodds | |
| 5,347,421 A | 9/1994 | Alexanian | |
| 5,365,210 A | 11/1994 | Hines | |
| 5,375,811 A | 12/1994 | Reinicke | |
| 5,402,303 A | 3/1995 | Luck | |
| D361,057 S | 8/1995 | Fayfield | |
| 5,441,233 A | 8/1995 | Asou | |
| 5,479,339 A | 12/1995 | Miller | |
| 5,482,080 A | 1/1996 | Bergmann | |
| 5,485,400 A | 1/1996 | Warrior | |
| 5,497,135 A | 3/1996 | Wisskirchen | |
| 5,546,063 A | 8/1996 | Hoffman | |
| 5,566,921 A | 10/1996 | Yokota | |
| 5,584,465 A | 12/1996 | Ochsenreiter | |
| 5,621,669 A | 4/1997 | Bjornsson | |
| 5,622,351 A | 4/1997 | Kim | |
| 5,638,847 A | 6/1997 | Hoch | |
| 5,645,264 A | 7/1997 | Kah | |
| 5,649,818 A | 7/1997 | Day | |
| 5,655,561 A | 8/1997 | Wendel | |
| 5,655,747 A | 8/1997 | Pasut | |
| 5,661,349 A | 8/1997 | Luck | |
| 5,687,759 A | 11/1997 | Tan | |
| 5,696,671 A | 12/1997 | Oliver | |
| 5,714,931 A | 2/1998 | Petite | |
| 5,730,423 A | 3/1998 | Wu | |
| 5,740,031 A | 4/1998 | Gagnon | |
| 5,760,706 A | 6/1998 | Kiss | |

(56) References Cited

U.S. PATENT DOCUMENTS

| | | | |
|---|---|---|---|
| 5,780,938 A | 7/1998 | Edwards |
| 5,785,298 A | 7/1998 | Kumar |
| 5,813,606 A | 9/1998 | Ziff |
| 5,825,664 A | 10/1998 | Warrior |
| 5,826,619 A | 10/1998 | Roman |
| 5,839,658 A | 11/1998 | Sarver |
| 5,848,609 A | 12/1998 | Marchesseault |
| 5,848,780 A | 12/1998 | Miller |
| 5,851,004 A | 12/1998 | Wu |
| 5,871,156 A | 2/1999 | Lawson |
| 5,895,026 A | 4/1999 | Linkner, Jr. |
| 5,914,847 A | 6/1999 | Alexanian |
| 5,915,665 A | 6/1999 | Paese |
| 5,926,531 A | 7/1999 | Petite |
| 5,927,607 A | 7/1999 | Scott |
| 5,938,172 A | 8/1999 | Ohtsuka |
| D413,650 S | 9/1999 | Sato |
| 5,961,045 A | 10/1999 | Doldren |
| 5,967,424 A | 10/1999 | Bonnah, II |
| 5,971,025 A | 10/1999 | Backlund |
| 5,979,482 A | 11/1999 | Scott |
| 5,996,608 A | 12/1999 | Hunter |
| 6,012,700 A | 1/2000 | Johnson |
| 6,021,038 A | 2/2000 | Hanchett |
| 6,028,522 A | 2/2000 | Petite |
| 6,040,752 A | 3/2000 | Fisher |
| 6,047,907 A | 4/2000 | Hornby |
| 6,047,947 A | 4/2000 | Kumar |
| 6,061,603 A | 5/2000 | Papadopoulos |
| 6,073,904 A | 6/2000 | Diller |
| 6,076,550 A | 6/2000 | Hiraishi |
| 6,076,801 A | 6/2000 | Duhack |
| 6,076,803 A | 6/2000 | Johnson |
| 6,079,433 A | 6/2000 | Saarem |
| 6,086,042 A | 7/2000 | Scott |
| D430,268 S | 8/2000 | Hiramatsu |
| 6,095,496 A | 8/2000 | Rydin |
| 6,098,898 A | 8/2000 | Storch |
| 6,124,775 A | 9/2000 | Linkner, Jr. |
| 6,126,141 A | 10/2000 | Geiger |
| 6,154,354 A | 11/2000 | Alexanian |
| 6,163,239 A | 12/2000 | Ozawa |
| 6,164,331 A | 12/2000 | Sugita |
| 6,179,268 B1 | 1/2001 | Seid |
| 6,186,413 B1 | 2/2001 | Lawson |
| 6,199,587 B1 | 3/2001 | Shlomi |
| 6,218,921 B1 | 4/2001 | Eberts |
| 6,218,953 B1 | 4/2001 | Petite |
| 6,219,903 B1 | 4/2001 | Osterhart |
| 6,220,275 B1 | 4/2001 | Nishinosono |
| 6,220,299 B1 | 4/2001 | Arvidsson |
| D443,030 S | 5/2001 | Kaneko |
| 6,224,033 B1 | 5/2001 | Kumar |
| 6,227,455 B1 | 5/2001 | Scott |
| 6,233,327 B1 | 5/2001 | Petite |
| 6,236,293 B1 | 5/2001 | Forster |
| 6,244,298 B1 | 6/2001 | Sugita |
| 6,263,901 B1 | 7/2001 | Lohde |
| 6,283,139 B1 | 9/2001 | Symonds |
| 6,293,516 B1 | 9/2001 | Parsons |
| 6,302,705 B1 * | 10/2001 | Yatskov ............ H01R 9/096 439/67 |
| 6,305,662 B1 | 10/2001 | Parsons |
| 6,314,340 B1 | 11/2001 | Mecham |
| 6,335,855 B1 | 1/2002 | Alexanian |
| 6,336,621 B1 | 1/2002 | Ii |
| 6,337,635 B1 | 1/2002 | Ericksen |
| 6,341,759 B1 | 1/2002 | Noller |
| 6,351,366 B1 | 2/2002 | Alexanian |
| 6,366,189 B1 | 4/2002 | Bergvall |
| 6,374,814 B1 | 4/2002 | Cook |
| 6,378,838 B1 | 4/2002 | Brundisini |
| 6,382,532 B1 | 5/2002 | French |
| 6,386,221 B1 | 5/2002 | Knoll |
| 6,386,505 B2 | 5/2002 | Reto Schoeb |
| 6,394,126 B2 | 5/2002 | Lohde |
| 6,394,413 B2 | 5/2002 | Lohde |
| D459,441 S | 6/2002 | Hayashi |
| 6,402,057 B1 | 6/2002 | Kimmel |
| 6,405,752 B1 | 6/2002 | Fritsch |
| 6,409,144 B1 | 6/2002 | Inami |
| D460,148 S | 7/2002 | Hayashi |
| 6,422,488 B1 | 7/2002 | Fochtman |
| 6,424,243 B1 | 7/2002 | Forster |
| 6,425,767 B1 * | 7/2002 | Lin ............ H05K 1/148 439/511 |
| 6,430,268 B1 | 8/2002 | Petite |
| 6,437,692 B1 | 8/2002 | Petite |
| 6,446,885 B1 | 9/2002 | Sims, Jr. |
| 6,450,478 B2 | 9/2002 | Parsons |
| 6,452,499 B1 | 9/2002 | Runge |
| 6,460,563 B2 | 10/2002 | Olson |
| 6,480,497 B1 | 11/2002 | Flammer, III |
| 6,481,646 B1 | 11/2002 | Hornby |
| 6,491,235 B1 | 12/2002 | Scott |
| 6,492,751 B1 | 12/2002 | Ineson |
| 6,498,558 B1 | 12/2002 | Linkner, Jr. |
| 6,499,677 B2 | 12/2002 | Dallmeyer |
| 6,501,359 B2 | 12/2002 | Matsuaka |
| 6,502,770 B2 | 1/2003 | Dallmeyer |
| 6,508,272 B1 | 1/2003 | Parsons |
| D470,823 S | 2/2003 | Ufer |
| 6,529,589 B1 | 3/2003 | Nelson |
| 6,536,681 B2 | 3/2003 | Dallmeyer |
| 6,542,059 B2 | 4/2003 | Sato |
| 6,543,744 B2 | 4/2003 | Carrillo |
| 6,546,945 B2 | 4/2003 | Ishigaki |
| 6,550,690 B2 | 4/2003 | Dallmeyer |
| 6,553,336 B1 | 4/2003 | Johnson |
| 6,557,580 B2 | 5/2003 | Lohde |
| 6,568,080 B2 | 5/2003 | Kimmel |
| 6,568,609 B2 | 5/2003 | Dallmeyer |
| D477,287 S | 7/2003 | Roman |
| 6,598,852 B2 | 7/2003 | Tomoda |
| 6,600,971 B1 | 7/2003 | Smith |
| 6,601,300 B2 | 8/2003 | Hasegawa |
| 6,604,726 B2 | 8/2003 | Kumar |
| 6,609,698 B1 | 8/2003 | Parsons |
| 6,616,120 B2 | 9/2003 | Barzuza |
| 6,616,249 B2 | 9/2003 | Han |
| 6,618,578 B1 | 9/2003 | Petite |
| 6,619,320 B2 | 9/2003 | Parsons |
| 6,619,614 B2 | 9/2003 | Parsons |
| 6,627,077 B2 | 9/2003 | Fritsch |
| 6,628,764 B1 | 9/2003 | Petite |
| 6,651,628 B2 | 11/2003 | Nally |
| 6,652,188 B1 | 11/2003 | Albright |
| 6,655,609 B2 | 12/2003 | Dallmeyer |
| 6,671,586 B2 | 12/2003 | Davis |
| 6,676,044 B2 | 1/2004 | Dallmeyer |
| 6,685,112 B1 | 2/2004 | Hornby |
| 6,685,158 B2 | 2/2004 | Parsons |
| 6,687,997 B2 | 2/2004 | Dallmeyer |
| 6,691,740 B2 | 2/2004 | Yoshida |
| 6,691,979 B2 | 2/2004 | Parsons |
| 6,694,223 B1 | 2/2004 | Goldberg |
| 6,695,281 B2 | 2/2004 | Williams |
| 6,707,174 B2 | 3/2004 | Lin |
| 6,708,084 B2 | 3/2004 | Battistutto |
| 6,715,732 B2 | 4/2004 | Kumar |
| 6,720,853 B1 | 4/2004 | Callis |
| 6,721,630 B1 | 4/2004 | Woytowitz |
| 6,722,628 B1 | 4/2004 | Seil |
| 6,745,457 B2 | 6/2004 | Noller |
| 6,747,557 B1 | 6/2004 | Petite |
| 6,748,976 B2 | 6/2004 | Sato |
| 6,749,136 B1 | 6/2004 | Wilson |
| 6,749,175 B2 | 6/2004 | Sato |
| 6,752,371 B2 | 6/2004 | Herbert |
| 6,756,871 B1 | 6/2004 | Suzuki |
| 6,763,287 B2 | 7/2004 | Brundisini |
| 6,766,221 B1 | 7/2004 | Christiansen |
| 6,766,825 B2 | 7/2004 | Antunez |
| 6,769,176 B2 | 8/2004 | Hornby |

(56) References Cited

U.S. PATENT DOCUMENTS

| | | |
|---|---|---|
| 6,778,099 B1 | 8/2004 | Meyer |
| 6,782,310 B2 | 8/2004 | Bailey |
| 6,782,311 B2 | 8/2004 | Barlow |
| 6,783,287 B2 | 8/2004 | Kudo |
| 6,784,807 B2 | 8/2004 | Petite |
| 6,791,442 B1 | 9/2004 | Schmidt |
| 6,792,323 B2 | 9/2004 | Krzyzanowski |
| 6,793,162 B2 | 9/2004 | Dallmeyer |
| 6,812,826 B2 | 11/2004 | Buhler |
| 6,823,239 B2 | 11/2004 | Sieminski |
| 6,830,232 B2 | 12/2004 | Burrola |
| 6,836,737 B2 | 12/2004 | Petite |
| 6,840,460 B2 | 1/2005 | Clark |
| 6,842,667 B2 | 1/2005 | Beutler |
| 6,848,632 B2 | 2/2005 | Clark |
| 6,851,622 B2 | 2/2005 | Demere |
| 6,851,631 B2 | 2/2005 | Dallmeyer |
| 6,853,883 B2 | 2/2005 | Kreikemeier |
| 6,854,706 B2 | 2/2005 | Sato |
| 6,862,498 B2 | 3/2005 | Davis |
| 6,874,535 B2 | 4/2005 | Parsons |
| 6,874,707 B2 | 4/2005 | Skinner |
| 6,877,526 B2 | 4/2005 | Burrola |
| 6,877,714 B2 | 4/2005 | Hall |
| 6,877,717 B2 | 4/2005 | Collins |
| 6,891,838 B1 | 5/2005 | Petite |
| 6,892,114 B1 | 5/2005 | Addink |
| 6,895,987 B2 | 5/2005 | Addink |
| 6,898,467 B1 | 5/2005 | Smith |
| 6,903,647 B2 | 6/2005 | Linkner, Jr. |
| 6,904,668 B2 | 6/2005 | Dallmeyer |
| 6,914,533 B2 | 7/2005 | Petite |
| 6,914,893 B2 | 7/2005 | Petite |
| 6,932,316 B2 | 8/2005 | Herbert |
| 6,932,320 B2 | 8/2005 | Fukano |
| 6,938,834 B2 | 9/2005 | Harris |
| 6,944,523 B2 | 9/2005 | Addink |
| 6,947,810 B2 | 9/2005 | Skinner |
| 6,947,854 B2 | 9/2005 | Swarztrauber |
| 6,948,697 B2 | 9/2005 | Herbert |
| 6,950,728 B1 | 9/2005 | Addink |
| 6,955,334 B2 | 10/2005 | Parsons |
| 6,955,337 B2 | 10/2005 | Weber |
| 6,959,904 B2 | 11/2005 | Beraldo |
| 6,963,808 B1 | 11/2005 | Addink |
| 6,971,684 B2 | 12/2005 | Ferrari |
| 6,978,794 B2 | 12/2005 | Dukes |
| 6,985,060 B2 | 1/2006 | Parker |
| 6,991,214 B2 | 1/2006 | Richter |
| 6,993,416 B2 | 1/2006 | Christiansen |
| 6,997,642 B2 | 2/2006 | Bishop |
| 7,000,890 B2 | 2/2006 | Bell |
| 7,003,357 B1 | 2/2006 | Kreikemeier |
| 7,004,450 B2 | 2/2006 | Yoshimura |
| 7,010,395 B1 | 3/2006 | Goldberg |
| 7,010,396 B2 | 3/2006 | Ware |
| 7,012,394 B2 | 3/2006 | Moore |
| 7,012,546 B1 | 3/2006 | Zigdon |
| 7,017,605 B2 | 3/2006 | Stroud |
| 7,019,667 B2 | 3/2006 | Petite |
| 7,021,750 B2 | 4/2006 | Shibata |
| 7,024,256 B2 | 4/2006 | Krzyzanowski |
| 7,050,887 B2 | 5/2006 | Alvarez |
| 7,053,767 B2 | 5/2006 | Petite |
| 7,058,478 B2 | 6/2006 | Alexanian |
| 7,058,479 B2 | 6/2006 | Miller |
| 7,059,548 B2 | 6/2006 | Reiter |
| 7,063,270 B2 | 6/2006 | Bowers |
| 7,069,115 B1 | 6/2006 | Woytowitz |
| D524,910 S | 7/2006 | Matsumoto |
| 7,069,941 B2 | 7/2006 | Parsons |
| 7,079,810 B2 | 7/2006 | Petite |
| D527,073 S | 8/2006 | Yajima |
| 7,084,741 B2 | 8/2006 | Plummer |
| 7,086,383 B2 | 8/2006 | Kirkens, IV |
| 7,093,362 B2 | 8/2006 | Dallmeyer |
| 7,103,511 B2 | 9/2006 | Petite |
| 7,106,158 B2 | 9/2006 | Forsythe |
| 7,123,993 B1 | 10/2006 | Freeman |
| 7,133,749 B2 | 11/2006 | Goldberg |
| 7,137,550 B1 | 11/2006 | Petite |
| 7,146,225 B2 | 12/2006 | Guenst |
| 7,146,254 B1 | 12/2006 | Howard |
| 7,146,255 B2 | 12/2006 | Christiansen |
| 7,156,363 B2 | 1/2007 | Parsons |
| 7,168,638 B2 | 1/2007 | Saito |
| 7,172,366 B1 | 2/2007 | Bishop |
| 7,181,319 B1 | 2/2007 | Woytowtiz |
| 7,182,272 B1 | 2/2007 | Marian |
| 7,182,311 B2 | 2/2007 | Kimble |
| 7,184,848 B2 | 2/2007 | Krzyzanowski |
| 7,184,861 B2 | 2/2007 | Petite |
| 7,187,262 B1 | 3/2007 | Henry |
| 7,187,285 B2 | 3/2007 | Staples |
| 7,188,822 B2 | 3/2007 | Marcichow |
| 7,196,602 B2 | 3/2007 | Adams |
| 7,206,669 B2 | 4/2007 | Christiansen |
| 7,209,840 B2 | 4/2007 | Petite |
| D541,905 S | 5/2007 | Yajima |
| D542,682 S | 5/2007 | Waki |
| 7,225,057 B2 | 5/2007 | Froman |
| 7,227,439 B2 | 6/2007 | Kelly |
| 7,240,740 B2 | 7/2007 | Reilly |
| 7,245,991 B1 | 7/2007 | Woytowitz |
| 7,246,787 B2 | 7/2007 | Kumar |
| 7,248,945 B2 | 7/2007 | Woytowitz |
| 7,249,749 B2 | 7/2007 | Niwa |
| 7,250,860 B2 | 7/2007 | Smith |
| D549,077 S | 8/2007 | Yajima |
| D549,241 S | 8/2007 | Giddens |
| 7,257,465 B2 | 8/2007 | Perez |
| 7,263,073 B2 | 8/2007 | Petite |
| 7,266,428 B2 | 9/2007 | Alexanian |
| 7,270,093 B2 | 9/2007 | Luercho |
| 7,273,206 B2 | 9/2007 | Sato |
| 7,280,019 B2 | 10/2007 | Kolb |
| 7,286,904 B2 | 10/2007 | Graham |
| 7,289,862 B2 | 10/2007 | Britton |
| 7,293,757 B2 | 11/2007 | Akabane |
| 7,295,128 B2 | 11/2007 | Petite |
| 7,303,147 B1 | 12/2007 | Danner |
| 7,305,280 B2 | 12/2007 | Marian |
| 7,309,033 B2 | 12/2007 | Dallmeyer |
| 7,317,972 B2 | 1/2008 | Addink |
| 7,325,564 B2 | 2/2008 | Ryuen |
| 7,325,781 B2 | 2/2008 | Parsons |
| 7,328,089 B2 | 2/2008 | Curren |
| 7,330,796 B2 | 2/2008 | Addink |
| D563,507 S | 3/2008 | Kato |
| 7,339,957 B2 | 3/2008 | Hitt |
| 7,346,463 B2 | 3/2008 | Petite |
| 7,347,383 B2 | 3/2008 | Dallmeyer |
| 7,358,626 B2 | 4/2008 | Gardner |
| 7,359,769 B2 | 4/2008 | Bailey |
| 7,378,768 B2 | 5/2008 | Ohkawa |
| 7,383,721 B2 | 6/2008 | Parsons |
| 7,383,851 B2 | 6/2008 | Jacobsen |
| 7,389,952 B2 | 6/2008 | Dallmeyer |
| 7,392,053 B1 | 6/2008 | Conner |
| 7,396,000 B2 | 7/2008 | Parsons |
| 7,397,907 B2 | 7/2008 | Petite |
| 7,398,139 B1 | 7/2008 | Woytowitz |
| 7,400,944 B2 | 7/2008 | Bailey |
| 7,403,840 B2 | 7/2008 | Moore |
| 7,406,363 B2 | 7/2008 | Doering |
| 7,412,245 B2 | 8/2008 | Guo |
| 7,412,303 B1 | 8/2008 | Porter |
| 7,412,317 B2 | 8/2008 | Takamatsu |
| 7,414,502 B2 | 8/2008 | Tackes |
| 7,421,317 B2 | 9/2008 | Christiansen |
| 7,422,160 B2 | 9/2008 | Dallmeyer |
| 7,423,985 B1 | 9/2008 | Hill |
| 7,424,527 B2 | 9/2008 | Petite |
| 7,429,006 B2 | 9/2008 | Dallmeyer |

(56) References Cited

U.S. PATENT DOCUMENTS

| | | |
|---|---|---|
| 7,437,778 B2 | 10/2008 | Parsons |
| 7,444,207 B2 | 10/2008 | Nickerson |
| D581,880 S | 12/2008 | Neitzel |
| 7,458,521 B2 | 12/2008 | Normanans, IV |
| 7,468,661 B2 | 12/2008 | Petite |
| 7,472,883 B2 | 1/2009 | Murao |
| 7,474,024 B2 | 1/2009 | Nakanishi |
| 7,475,863 B2 | 1/2009 | Donovan |
| 7,480,501 B2 | 1/2009 | Petite |
| 7,487,798 B2 | 2/2009 | Furuta |
| 7,487,925 B2 | 2/2009 | Skinner |
| 7,503,346 B1 | 3/2009 | Clark |
| 7,503,347 B2 | 3/2009 | Ryuen |
| 7,520,449 B2 | 4/2009 | Matsuo |
| 7,526,365 B1 | 4/2009 | Frerich |
| 7,530,506 B2 | 5/2009 | Kato |
| 7,532,100 B2 | 5/2009 | Henry |
| 7,546,181 B2 | 6/2009 | Vidovich |
| 7,556,537 B2 | 7/2009 | Schenk |
| 7,558,650 B2 | 7/2009 | Thornton |
| 7,562,399 B2 | 7/2009 | Parsons |
| 7,564,842 B2 | 7/2009 | Callaway, Jr. |
| 7,567,858 B1 | 7/2009 | Dunlap |
| 7,574,284 B2 | 8/2009 | Goldberg |
| 7,574,285 B2 | 8/2009 | Kah |
| 7,584,023 B1 | 9/2009 | Palmer |
| 7,596,429 B2 | 9/2009 | Cardinal |
| D603,015 S | 10/2009 | Matsumura |
| 7,613,547 B1 | 11/2009 | Woytowitz |
| 7,619,322 B2 | 11/2009 | Gardner |
| 7,637,475 B2 | 12/2009 | Adams |
| 7,640,079 B2 | 12/2009 | Nickerson |
| 7,643,823 B2 | 1/2010 | Shamoon |
| 7,650,425 B2 | 1/2010 | Davis |
| 7,665,713 B1 | 2/2010 | Clark |
| 7,668,532 B2 | 2/2010 | Shamoon |
| 7,668,990 B2 | 2/2010 | Krzyzanowski |
| D611,001 S | 3/2010 | Ihde |
| 7,690,623 B2 | 4/2010 | Parsons |
| 7,694,934 B2 | 4/2010 | Irwin |
| 7,697,248 B2 | 4/2010 | Tomimbang |
| 7,697,492 B2 | 4/2010 | Petite |
| 7,701,314 B2 | 4/2010 | Hazzard |
| 7,703,707 B2 | 4/2010 | Yasukawa |
| 7,703,709 B2 | 4/2010 | Akabane |
| 7,707,125 B2 | 4/2010 | Haji-Valizadeh |
| D615,618 S | 5/2010 | Someya |
| 7,710,226 B2 | 5/2010 | Nelson |
| 7,711,454 B2 | 5/2010 | Addink |
| 7,711,796 B2 | 5/2010 | Gutt |
| 7,719,394 B2 | 5/2010 | Nelson |
| 7,719,432 B1 | 5/2010 | Hill |
| 7,726,630 B2 | 6/2010 | Cripps |
| 7,731,154 B2 | 6/2010 | Parsons |
| 7,735,513 B2 | 6/2010 | Bush |
| 7,738,999 B2 | 6/2010 | Petite |
| 7,739,378 B2 | 6/2010 | Petite |
| 7,756,086 B2 | 7/2010 | Petite |
| 7,762,523 B2 | 7/2010 | Smith |
| D622,226 S | 8/2010 | Crist |
| D622,709 S | 8/2010 | Hern |
| 7,772,726 B1 | 8/2010 | Porter |
| 7,792,612 B2 | 9/2010 | Kah |
| 7,806,382 B1 | 10/2010 | Palumbo |
| 7,826,931 B2 | 11/2010 | Lorenz |
| 7,830,231 B2 | 11/2010 | Carlino |
| 7,844,368 B2 | 11/2010 | Alexanian |
| 7,844,369 B2 | 11/2010 | Nickerson |
| 7,857,282 B2 | 12/2010 | Goossens |
| 7,870,080 B2 | 1/2011 | Budike, Jr. |
| 7,877,168 B1 | 1/2011 | Porter |
| RE42,084 E | 2/2011 | Ingvar |
| D633,180 S | 2/2011 | Duong |
| 7,883,027 B2 | 2/2011 | Fekete |
| 7,895,993 B2 | 3/2011 | Weisz |
| 7,899,580 B2 | 3/2011 | Cardinal |
| 7,899,581 B1 | 3/2011 | Woytowitz |
| 7,911,341 B2 | 3/2011 | Raji |
| D636,278 S | 4/2011 | Franchini |
| 7,921,480 B2 | 4/2011 | Parsons |
| 7,922,150 B2 | 4/2011 | Cripps |
| 7,930,069 B2 | 4/2011 | Savelle |
| 7,933,945 B2 | 4/2011 | Krzyzanowski |
| 7,938,340 B2 | 5/2011 | Anderson |
| 7,950,416 B2 | 5/2011 | Nakai |
| 7,953,517 B1 | 5/2011 | Porter |
| 7,959,129 B2 | 6/2011 | Matsumoto |
| 7,962,101 B2 | 6/2011 | Vaswani |
| 7,962,244 B2 | 6/2011 | Alexanian |
| 7,973,627 B2 | 7/2011 | Yamagata |
| 7,978,059 B2 | 7/2011 | Petite |
| 7,981,386 B2 | 7/2011 | McAvoy |
| 7,982,564 B2 | 7/2011 | Farrar |
| 7,982,565 B2 | 7/2011 | Bradfield |
| 7,983,574 B2 | 7/2011 | Kolb |
| 7,996,115 B2 | 8/2011 | Nickerson |
| 8,006,719 B2 | 8/2011 | Nordstrom |
| 8,006,951 B2 | 8/2011 | Guggenmos |
| 8,010,238 B2 | 8/2011 | Ensworth |
| 8,013,732 B2 | 9/2011 | Petite |
| 8,019,482 B2 | 9/2011 | Sutardja |
| 8,024,075 B2 | 9/2011 | Fekete |
| 8,026,781 B2 | 9/2011 | Freakes |
| 8,028,970 B2 | 10/2011 | Fukano |
| 8,031,650 B2 | 10/2011 | Petite |
| 8,037,853 B2 | 10/2011 | Luercho |
| 8,037,901 B2 | 10/2011 | Matsumoto |
| 8,042,049 B2 | 10/2011 | Killian |
| 8,042,202 B2 | 10/2011 | Parsons |
| D648,000 S | 11/2011 | Shimura |
| 8,055,389 B2 | 11/2011 | Holindrake |
| 8,061,685 B2 | 11/2011 | Ueda |
| 8,064,412 B2 | 11/2011 | Petite |
| 8,064,935 B2 | 11/2011 | Shamoon |
| 8,070,129 B2 | 12/2011 | Makino |
| 8,081,053 B2 | 12/2011 | Yamagata |
| 8,104,993 B2 | 1/2012 | Hitt |
| 8,108,078 B2 | 1/2012 | Lorenz |
| 8,116,889 B2 | 2/2012 | Krzyzanowski |
| 8,127,746 B2 | 3/2012 | Escandell |
| 8,127,790 B2 | 3/2012 | Van Weelden |
| 8,127,791 B2 | 3/2012 | Najmolhoda |
| 8,128,059 B2 | 3/2012 | Uechi |
| 8,141,585 B2 | 3/2012 | Tschurtz |
| 8,145,360 B2 | 3/2012 | Brundisini |
| 8,160,750 B2 | 4/2012 | Weiler |
| 8,170,721 B2 | 5/2012 | Nickerson |
| 8,171,136 B2 | 5/2012 | Petite |
| 8,185,248 B2 | 5/2012 | Ensworth |
| 8,186,378 B2 | 5/2012 | Nordstrom |
| 8,188,821 B2 | 5/2012 | Nelson |
| 8,193,930 B2 | 6/2012 | Petite |
| 8,196,064 B2 | 6/2012 | Krzyzanowski |
| 8,200,368 B2 | 6/2012 | Nickerson |
| 8,209,061 B2 | 6/2012 | Palmer |
| 8,212,667 B2 | 7/2012 | Petite |
| 8,214,496 B2 | 7/2012 | Gutt |
| 8,215,327 B2 | 7/2012 | Bush |
| 8,215,610 B2 | 7/2012 | Shiao |
| 8,219,254 B2 | 7/2012 | O'Connor |
| 8,219,935 B2 | 7/2012 | Hunts |
| 8,220,776 B2 | 7/2012 | Tagata |
| 8,223,010 B2 | 7/2012 | Petite |
| 8,224,493 B2 | 7/2012 | Walker |
| 8,225,810 B2 | 7/2012 | Blanchard |
| 8,235,352 B2 | 8/2012 | Irwin |
| 8,244,404 B2 | 8/2012 | Nickerson |
| 8,245,402 B2 | 8/2012 | Seitter |
| 8,246,004 B2 | 8/2012 | Kratzer |
| 8,260,465 B2 | 9/2012 | Crist |
| 8,261,770 B2 | 9/2012 | Bush |
| 8,264,312 B2 | 9/2012 | Hamaoka |
| 8,264,313 B2 | 9/2012 | Sasao |
| 8,265,797 B2 | 9/2012 | Nickerson |

(56) References Cited

U.S. PATENT DOCUMENTS

| | | |
|---|---|---|
| 8,274,171 B2 | 9/2012 | Korol |
| 8,274,348 B2 | 9/2012 | Kolb |
| 8,276,878 B2 | 10/2012 | Parsons |
| 8,295,985 B2 | 10/2012 | Crist |
| 8,297,314 B2 | 10/2012 | Clark |
| 8,297,589 B2 | 10/2012 | Dourdeville |
| 8,301,309 B1 | 10/2012 | Woytoxitz |
| 8,305,168 B2 | 11/2012 | Ivan Cotic |
| 8,310,322 B2 | 11/2012 | Tomimbang |
| 8,326,440 B2 | 12/2012 | Christfort |
| 8,335,304 B2 | 12/2012 | Petite |
| 8,335,842 B2 | 12/2012 | Raji |
| 8,347,918 B2 | 1/2013 | Shimizu |
| 8,348,230 B2 | 1/2013 | Michl |
| 8,348,231 B2 | 1/2013 | Czimmek |
| 8,371,331 B2 | 2/2013 | Najmolhoda |
| 8,374,726 B2 | 2/2013 | Holindrake |
| 8,379,564 B2 | 2/2013 | Petite et al. |
| 8,382,064 B2 | 2/2013 | Nisinosono |
| 8,387,653 B2 | 3/2013 | Bush |
| 8,396,606 B2 | 3/2013 | Forbes, Jr. |
| 8,401,705 B2 | 3/2013 | Alexanian |
| 8,410,931 B2 | 4/2013 | Petite |
| 8,412,382 B2 | 4/2013 | Imes et al. |
| 8,416,041 B2 | 4/2013 | Freakes |
| 8,417,390 B2 | 4/2013 | Nickerson |
| 8,421,566 B2 | 4/2013 | Sasao |
| 8,425,020 B2 | 4/2013 | Borra |
| 8,430,376 B1 | 4/2013 | Danner |
| 8,432,242 B2 | 4/2013 | Irwin |
| 8,433,448 B2 | 4/2013 | Walker |
| 8,436,704 B1 | 5/2013 | Venkataraghavan et al. |
| 8,437,879 B2 | 5/2013 | Anderson |
| 8,443,829 B2 | 5/2013 | Czimmek |
| 8,446,884 B2 | 5/2013 | Petite et al. |
| 8,447,843 B2 | 5/2013 | Johnson |
| 8,448,916 B2 | 5/2013 | Kratzer |
| 8,457,798 B2 | 6/2013 | Hackett |
| 8,465,131 B2 | 6/2013 | Hibbard |
| 8,469,334 B2 | 6/2013 | Yamagata |
| 8,474,787 B2 | 7/2013 | Fink |
| 8,478,871 B2 | 7/2013 | Gutt |
| 8,485,619 B2 | 7/2013 | Borra |
| 8,490,646 B2 | 7/2013 | Bush |
| 8,494,683 B2 | 7/2013 | Piper |
| 8,496,025 B2 | 7/2013 | Parsons |
| 8,500,226 B2 | 8/2013 | Hibbard |
| 8,504,210 B2 | 8/2013 | Ensworth |
| 8,505,566 B2 | 8/2013 | Nguyen |
| 8,505,573 B2 | 8/2013 | Herbert |
| 8,516,087 B2 | 8/2013 | Wilson |
| 8,527,549 B2 | 9/2013 | Cidon |
| 8,528,834 B2 | 9/2013 | Skinner |
| 8,529,028 B2 | 9/2013 | Borra |
| 8,532,831 B2 | 9/2013 | Crist |
| 8,534,641 B2 | 9/2013 | Schalowski |
| 8,538,592 B2 | 9/2013 | Alexanian |
| 8,540,353 B2 | 9/2013 | Mallory |
| 8,548,632 B1 | 10/2013 | Porter |
| 8,550,427 B2 | 10/2013 | Yoshida |
| 8,556,227 B2 | 10/2013 | Buestgens |
| 8,556,228 B2 | 10/2013 | Marcichow |
| 8,556,232 B2 | 10/2013 | Oikawa |
| 8,556,393 B2 | 10/2013 | Mallory |
| 8,558,653 B2 | 10/2013 | Wo |
| 8,565,904 B2 | 10/2013 | Bragg et al. |
| 8,567,755 B2 | 10/2013 | Najmolhoda |
| 8,573,255 B2 | 11/2013 | Pifer |
| 8,576,032 B2 | 11/2013 | Herbert |
| 8,579,251 B2 | 11/2013 | Ambrosi |
| 8,581,682 B2 | 11/2013 | Patino |
| 8,584,704 B2 | 11/2013 | Pifer |
| 8,596,774 B2 | 12/2013 | Borra |
| 8,600,569 B2 | 12/2013 | Woytowitz |
| 8,606,415 B1 | 12/2013 | Woytowitz |
| 8,613,420 B2 | 12/2013 | Linortner |
| 8,620,480 B2 | 12/2013 | Alexanian |
| 8,620,481 B2 | 12/2013 | Holindrake |
| 8,630,743 B2 | 1/2014 | Marsters |
| 8,632,050 B2 | 1/2014 | Stoeckel |
| 8,635,350 B2 | 1/2014 | Gutt |
| 8,636,346 B2 | 1/2014 | Borra |
| 8,641,177 B2 | 2/2014 | Borra |
| 8,649,907 B2 | 2/2014 | Ersavas |
| 8,650,069 B2 | 2/2014 | Mason, Sr. et al. |
| 8,650,898 B2 | 2/2014 | Ma |
| 8,651,453 B2 | 2/2014 | Heyer |
| 8,659,183 B2 | 2/2014 | Crist |
| 8,659,372 B2 | 2/2014 | Morimura |
| 8,660,705 B2 | 2/2014 | Woytowitz |
| 8,662,471 B2 | 3/2014 | Ohmi |
| 8,662,647 B2 | 3/2014 | Rosati |
| 8,669,836 B2 | 3/2014 | Kulke |
| 8,678,343 B2 | 3/2014 | Czimmek |
| 8,690,118 B2 | 4/2014 | Bunni |
| 8,695,620 B2 | 4/2014 | Bush |
| 8,700,222 B1 | 4/2014 | Woytowitz |
| 8,708,466 B2 | 4/2014 | Mallory |
| 8,712,592 B2 | 4/2014 | Carlson et al. |
| 8,714,519 B2 | 5/2014 | Voss |
| 8,717,133 B2 | 5/2014 | Ooishi |
| 8,720,400 B2 | 5/2014 | Dinkel |
| 8,727,511 B2 | 5/2014 | Mallory |
| 8,733,393 B2 | 5/2014 | Najmolhoda |
| 8,733,395 B2 | 5/2014 | Najmolhoda |
| 8,733,908 B2 | 5/2014 | Borra |
| 8,736,409 B2 | 5/2014 | Mita |
| 8,738,188 B2 | 5/2014 | Nickerson |
| 8,738,189 B2 | 5/2014 | Alexanian |
| D706,389 S | 6/2014 | McLauchlan |
| D706,390 S | 6/2014 | McLauchlan |
| 8,739,830 B2 | 6/2014 | Bradbury et al. |
| 8,740,113 B2 | 6/2014 | Roessle |
| 8,751,052 B1 | 6/2014 | Campbell |
| 8,757,209 B2 | 6/2014 | Morgan |
| 8,757,584 B2 | 6/2014 | Bill |
| 8,757,586 B2 | 6/2014 | Gruen |
| 8,757,587 B2 | 6/2014 | Miura |
| 8,777,388 B2 | 7/2014 | Borra |
| 8,783,653 B2 | 7/2014 | Jamison |
| 8,793,024 B1 | 7/2014 | Woytowitz |
| 8,793,025 B2 | 7/2014 | Lorenz |
| 8,794,748 B2 | 8/2014 | Borra |
| 8,807,725 B2 | 8/2014 | Borra |
| 8,812,007 B2 | 8/2014 | Hitt |
| 8,817,431 B2 | 8/2014 | Tomimbang |
| 8,827,236 B2 | 9/2014 | Mangiafico |
| 8,839,135 B2 | 9/2014 | Vander Griend et al. |
| 8,840,084 B2 | 9/2014 | Crist |
| 8,847,716 B2 | 9/2014 | Fonville |
| 8,849,461 B2 | 9/2014 | Ersavas |
| 8,851,447 B2 | 10/2014 | Crist |
| 8,854,165 B2 | 10/2014 | Irwin |
| 8,862,277 B1 | 10/2014 | Campbell |
| 8,868,246 B2 | 10/2014 | Thornton |
| 8,879,218 B2 | 11/2014 | Tomimbang |
| 8,880,204 B2 | 11/2014 | Frei |
| 8,882,247 B2 | 11/2014 | Borra |
| 8,890,505 B2 | 11/2014 | Forbes, Jr. |
| 8,909,381 B2 | 12/2014 | Crist |
| 8,911,621 B2 | 12/2014 | Lippert |
| 8,924,587 B2 | 12/2014 | Petite |
| 8,924,588 B2 | 12/2014 | Petite |
| 8,924,891 B2 | 12/2014 | Hunts et al. |
| 8,930,032 B2 | 1/2015 | Shupe et al. |
| 8,931,758 B2 | 1/2015 | Kasagi |
| 8,936,041 B2 | 1/2015 | Yun |
| 8,944,100 B2 | 2/2015 | Pifer |
| 8,944,101 B2 | 2/2015 | Pifer |
| 8,948,921 B2 | 2/2015 | Halahan et al. |
| 8,955,822 B2 | 2/2015 | Parsons |
| 8,957,748 B2 | 2/2015 | Tomimbang |
| 8,960,233 B2 | 2/2015 | Nishinosono et al. |
| 8,967,746 B2 | 3/2015 | Borra |

(56) References Cited

U.S. PATENT DOCUMENTS

| | | |
|---|---|---|
| 8,973,895 B2 | 3/2015 | Thomas |
| 8,977,400 B1 | 3/2015 | Porter |
| 8,985,550 B2 | 3/2015 | Miura |
| 8,991,955 B2 | 3/2015 | Borra |
| 8,995,098 B2 | 3/2015 | Tomimbang |
| 8,996,183 B2 | 3/2015 | Forbes, Jr. |
| 8,998,114 B2 | 4/2015 | Olivier |
| D728,746 S | 5/2015 | McLauchlan |
| D728,747 S | 5/2015 | McLauchlan |
| 9,032,998 B2 | 5/2015 | O'Brien |
| 9,043,036 B2 | 5/2015 | Fekete |
| 9,049,821 B1 | 6/2015 | Hanna |
| 9,068,663 B2 | 6/2015 | Zhang |
| 9,069,337 B2 | 6/2015 | Forbes, Jr. |
| 9,074,699 B2 | 7/2015 | Jamison |
| 9,114,365 B2 | 8/2015 | Schmitt |
| 9,117,577 B2 | 8/2015 | Zurke |
| 9,127,780 B2 | 9/2015 | Schnelker |
| 9,130,402 B2 | 9/2015 | Forbes, Jr. |
| 9,131,642 B2 | 9/2015 | Groeneveld |
| 9,140,378 B2 | 9/2015 | Da Pont |
| 9,149,013 B2 | 10/2015 | Andrews |
| 9,157,545 B2 | 10/2015 | Czimmek |
| 9,161,499 B2 | 10/2015 | Bailey |
| 9,169,626 B2 | 10/2015 | Guler |
| 9,169,941 B2 | 10/2015 | Lee |
| 9,183,163 B2 | 11/2015 | Frei |
| 9,184,524 B2 | 11/2015 | Tomita |
| 9,185,365 B2 | 11/2015 | Hong |
| 9,192,110 B2 | 11/2015 | Standerfer et al. |
| 9,201,815 B2 | 12/2015 | Frei |
| 9,208,676 B2 | 12/2015 | Fadell |
| 9,222,593 B1 | 12/2015 | Clark |
| D747,784 S | 1/2016 | McLauchlan |
| 9,241,451 B2 | 1/2016 | Ersavas |
| 9,244,449 B2 | 1/2016 | Tennyson |
| 9,249,895 B2 | 2/2016 | Hettinger |
| 9,258,952 B2 | 2/2016 | Walker |
| D750,746 S | 3/2016 | McLauchlan |
| 9,279,756 B2 | 3/2016 | Bush |
| 9,288,102 B2 | 3/2016 | Sobhy |
| 9,301,460 B2 | 4/2016 | Runge |
| 9,305,694 B2 | 4/2016 | Shimizu |
| 9,320,205 B2 | 4/2016 | Ensworth |
| 9,343,853 B2 | 5/2016 | Okada |
| 9,348,338 B2 | 5/2016 | Nickerson |
| 9,366,351 B2 | 6/2016 | Engler |
| 9,371,803 B2 | 6/2016 | Pifer |
| 9,377,123 B2 | 6/2016 | Kibune |
| 9,389,157 B2 | 7/2016 | Bush |
| 9,395,010 B2 | 7/2016 | Jamison |
| 9,416,883 B2 | 8/2016 | Van Den Bijgaart et al. |
| 9,425,978 B2 | 8/2016 | Frei et al. |
| 9,435,460 B2 | 9/2016 | Herbert |
| 9,470,332 B2 | 10/2016 | Miura |
| 9,488,097 B2 | 11/2016 | Steinman |
| 9,493,936 B2 | 11/2016 | Bush |
| 9,500,291 B2 | 11/2016 | Pifer Daniel Lee |
| 9,528,626 B2 | 12/2016 | Holmes |
| 9,551,427 B2 | 1/2017 | Van Den Bijgaart et al. |
| 9,583,248 B2 | 2/2017 | Toda |
| 9,598,847 B2 | 3/2017 | Marcichow |
| 9,602,655 B2 | 3/2017 | Shamoon |
| 9,627,121 B2 | 4/2017 | Peterson |
| 9,665,106 B2 | 5/2017 | Lorenz |
| 1,561,673 A1 | 6/2017 | Pelin Ersavas |
| 9,678,485 B2 | 6/2017 | Malaugh |
| 9,679,690 B2 | 6/2017 | Nila |
| 9,681,610 B2 | 6/2017 | Crist |
| 9,683,472 B2 | 6/2017 | Thomas |
| 9,703,275 B2 | 7/2017 | Ersavas |
| 9,704,122 B2 | 7/2017 | Jung |
| 9,733,274 B2 | 8/2017 | Pietrowicz |
| 9,746,097 B1 | 8/2017 | Ishii |
| 9,756,797 B2 | 9/2017 | Sarver |
| 9,763,393 B2 | 9/2017 | Parsons |
| 9,766,609 B2 | 9/2017 | Kah, Jr. |
| 9,781,887 B2 | 10/2017 | Woytowitz |
| 9,800,463 B2 | 10/2017 | Imes |
| 9,814,190 B1 | 11/2017 | Stange |
| 9,822,514 B2 | 11/2017 | Parsons |
| 9,829,869 B2 | 11/2017 | Ersavas |
| 9,832,939 B2 | 12/2017 | Russell |
| 9,872,445 B2 | 1/2018 | Cline |
| 9,927,045 B2 | 3/2018 | Morgan |
| 9,945,492 B2 | 4/2018 | Timmermans |
| 9,978,553 B2 | 5/2018 | Tomimbang |
| 1,002,444 A1 | 7/2018 | Watanabe |
| 1,004,140 A1 | 8/2018 | Lenk |
| 10,058,042 B2 | 8/2018 | Crist |
| D829,304 S | 9/2018 | McLauchlan |
| 10,070,596 B2 | 9/2018 | Crist |
| 1,012,589 A1 | 11/2018 | Bahr |
| 1,013,900 A1 | 11/2018 | Muraoka |
| 1,015,139 A1 | 12/2018 | Muraoka |
| 1,018,805 A1 | 1/2019 | Walker |
| 1,021,419 A1 | 2/2019 | Dreyer |
| 10,194,599 B2 | 2/2019 | Ensworth |
| 10,201,133 B2 | 2/2019 | Tennyson |
| 1,028,818 A1 | 5/2019 | Schieweck |
| 1,036,273 A1 | 7/2019 | Ersavas |
| 1,038,844 A1 | 8/2019 | Ott |
| 10,390,502 B2 | 8/2019 | Lorenz |
| 1,050,233 A1 | 12/2019 | Koyama |
| 1,071,626 A1 | 7/2020 | Ersavas |
| 10,772,267 B2 | 9/2020 | Tennyson |
| 2001/0002210 A1 | 5/2001 | Petite |
| 2001/0024163 A1 | 9/2001 | Petite |
| 2001/0049563 A1 | 12/2001 | Addink |
| 2002/0012323 A1 | 1/2002 | Petite |
| 2002/0013679 A1 | 1/2002 | Petite |
| 2002/0019712 A1 | 2/2002 | Petite |
| 2002/0019725 A1 | 2/2002 | Petite |
| 2002/0027504 A1 | 3/2002 | Davis |
| 2002/0031101 A1 | 3/2002 | Petite |
| 2002/0035414 A1 | 3/2002 | Morikawa |
| 2002/0053970 A1 | 5/2002 | Plummer |
| 2002/0071234 A1 | 6/2002 | Alexanian |
| 2002/0085333 A1 | 7/2002 | Alexanian |
| 2002/0088875 A1 | 7/2002 | Sirkin |
| 2002/0091452 A1 | 7/2002 | Addink |
| 2002/0096655 A1 | 7/2002 | Balsdon |
| 2002/0109608 A1 | 8/2002 | Petite |
| 2002/0125998 A1 | 9/2002 | Petite |
| 2002/0130287 A1 | 9/2002 | Smith |
| 2002/0138969 A1 | 10/2002 | Dallmeyer |
| 2002/0145125 A1 | 10/2002 | Tomoda |
| 2002/0166986 A1 | 11/2002 | Remby |
| 2002/0169643 A1 | 11/2002 | Petite |
| 2003/0006882 A1 | 1/2003 | Buhler |
| 2003/0036810 A1 | 2/2003 | Petite |
| 2003/0036822 A1 | 2/2003 | Davis |
| 2003/0042451 A1 | 3/2003 | Bendzinski |
| 2003/0051759 A1 | 3/2003 | Schmidt |
| 2003/0067889 A1 | 4/2003 | Petite |
| 2003/0078029 A1 | 4/2003 | Petite |
| 2003/0093159 A1 | 5/2003 | Sieminski |
| 2003/0093484 A1 | 5/2003 | Petite |
| 2003/0102453 A1 | 6/2003 | Fukano |
| 2003/0120393 A1 | 6/2003 | Bailey |
| 2003/0135286 A1 | 7/2003 | Brundisini |
| 2003/0179102 A1 | 9/2003 | Barnes |
| 2003/0201675 A1 | 10/2003 | Alexanian |
| 2004/0020538 A1 | 2/2004 | Antunez |
| 2004/0039489 A1 | 2/2004 | Moore |
| 2004/0046137 A1 | 3/2004 | Herbert |
| 2004/0051069 A1 | 3/2004 | Miyazoe |
| 2004/0053639 A1 | 3/2004 | Petite |
| 2004/0070302 A1 | 4/2004 | Parker |
| 2004/0083833 A1 | 5/2004 | Hitt |
| 2004/0086053 A1 | 5/2004 | Anderson |
| 2004/0088083 A1 | 5/2004 | Davis |
| 2004/0090329 A1 | 5/2004 | Hitt |
| 2004/0090345 A1 | 5/2004 | Hitt |

(56) References Cited

U.S. PATENT DOCUMENTS

| | | |
|---|---|---|
| 2004/0100394 A1 | 5/2004 | Hitt |
| 2004/0183687 A1 | 9/2004 | Petite |
| 2004/0225412 A1 | 11/2004 | Alexanian |
| 2005/0000579 A1 | 1/2005 | Burrola |
| 2005/0004715 A1 | 1/2005 | Christiansen |
| 2005/0030199 A1 | 2/2005 | Petite |
| 2005/0038529 A1 | 2/2005 | Perez |
| 2005/0043059 A1 | 2/2005 | Petite |
| 2005/0043860 A1 | 2/2005 | Petite |
| 2005/0055106 A1 | 3/2005 | Beutler |
| 2005/0087620 A1 | 4/2005 | Bowers |
| 2005/0090936 A1 | 4/2005 | Hitt |
| 2005/0098752 A1 | 5/2005 | Burrola |
| 2005/0150560 A1 | 7/2005 | Amato |
| 2005/0156067 A1 | 7/2005 | Ivans |
| 2005/0156068 A1 | 7/2005 | Ivans |
| 2005/0171646 A1 | 8/2005 | Miller |
| 2005/0190055 A1 | 9/2005 | Petite |
| 2005/0192710 A1 | 9/2005 | Thornton |
| 2005/0195768 A1 | 9/2005 | Petite |
| 2005/0195775 A1 | 9/2005 | Petite |
| 2005/0201397 A1 | 9/2005 | Petite |
| 2005/0216580 A1 | 9/2005 | Raji |
| 2005/0243867 A1 | 11/2005 | Petite |
| 2005/0264973 A1 | 12/2005 | Gardner |
| 2005/0273205 A1 | 12/2005 | Nickerson |
| 2006/0009928 A1 | 1/2006 | Addink |
| 2006/0029060 A1 | 2/2006 | Pister |
| 2006/0029061 A1 | 2/2006 | Pister |
| 2006/0043208 A1 | 3/2006 | Graham |
| 2006/0049271 A1 | 3/2006 | Hitt |
| 2006/0076527 A1 | 4/2006 | Bush |
| 2006/0080003 A1 | 4/2006 | Christiansen |
| 2006/0091245 A1 | 5/2006 | Ivans |
| 2006/0108552 A1 | 5/2006 | Herbert |
| 2006/0116793 A1 | 6/2006 | Christiansen |
| 2006/0155489 A1 | 7/2006 | Addink |
| 2006/0161309 A1 | 7/2006 | Moore |
| 2006/0178847 A1 | 8/2006 | Glancy |
| 2006/0181406 A1 | 8/2006 | Petite |
| 2006/0184285 A1 | 8/2006 | Evelyn-Veere |
| 2006/0185654 A1 | 8/2006 | Modien |
| 2006/0206239 A1 | 9/2006 | Christiansen |
| 2006/0271297 A1 | 11/2006 | Repelli |
| 2006/0272830 A1 | 12/2006 | Fima |
| 2006/0282467 A1 | 12/2006 | Peterson |
| 2007/0010915 A1 | 1/2007 | Burson |
| 2007/0016334 A1 | 1/2007 | Smith |
| 2007/0035907 A1 | 2/2007 | Doering |
| 2007/0057217 A1 | 3/2007 | Kamidate |
| 2007/0061048 A1 | 3/2007 | Lorenz |
| 2007/0088462 A1 | 4/2007 | Peleg |
| 2007/0106426 A1 | 5/2007 | Ensworth |
| 2007/0135973 A1 | 6/2007 | Petite |
| 2007/0140274 A1 | 6/2007 | Battistutto |
| 2007/0179674 A1 | 8/2007 | Ensworth |
| 2007/0191991 A1 | 8/2007 | Addink |
| 2007/0203860 A1 | 8/2007 | Golden |
| 2007/0208521 A1 | 9/2007 | Petite |
| 2007/0221750 A1 | 9/2007 | Roberts |
| 2007/0222581 A1 | 9/2007 | Hawkins |
| 2007/0239317 A1 | 10/2007 | Bogolea |
| 2007/0257757 A1 | 11/2007 | Kolb |
| 2007/0261245 A1 | 11/2007 | Hayashi |
| 2007/0282486 A1 | 12/2007 | Walker |
| 2007/0286210 A1 | 12/2007 | Gutt |
| 2007/0286369 A1 | 12/2007 | Gutt |
| 2007/0291689 A1 | 12/2007 | Kapur |
| 2007/0293990 A1 | 12/2007 | Alexanain |
| 2008/0001595 A1 | 1/2008 | Ha |
| 2008/0027586 A1 | 1/2008 | Hern |
| 2008/0027587 A1 | 1/2008 | Nickerson |
| 2008/0033775 A1 | 2/2008 | Dawson |
| 2008/0039978 A1 | 2/2008 | Graham |
| 2008/0040509 A1 | 2/2008 | Werb |
| 2008/0051036 A1 | 2/2008 | Vaswani |
| 2008/0058995 A1 | 3/2008 | Holindrake |
| 2008/0097653 A1 | 4/2008 | Kaprielian |
| 2008/0119948 A1 | 5/2008 | O'Connor |
| 2008/0129495 A1 | 6/2008 | Hitt |
| 2008/0136620 A1 | 6/2008 | Lee |
| 2008/0147205 A1 | 6/2008 | Ollis |
| 2008/0148725 A1 | 6/2008 | Jacobsen |
| 2008/0154437 A1 | 6/2008 | Alexanian |
| 2008/0157995 A1 | 7/2008 | Crist |
| 2008/0180240 A1 | 7/2008 | Raji |
| 2008/0183842 A1 | 7/2008 | Raji |
| 2008/0199359 A1 | 8/2008 | Davis |
| 2008/0204176 A1 | 8/2008 | Konjanatiraksat, Sr. |
| 2008/0211307 A1 | 9/2008 | Gardner |
| 2008/0253327 A1 | 10/2008 | Kohvakka |
| 2008/0272208 A1 | 11/2008 | Anderson |
| 2008/0275595 A1 | 11/2008 | Bailey |
| 2008/0288116 A1 | 11/2008 | Nickerson |
| 2008/0288117 A1 | 11/2008 | Nickerson |
| 2008/0289693 A1 | 11/2008 | Irwin |
| 2008/0297288 A1 | 12/2008 | Irwin |
| 2008/0302172 A1 | 12/2008 | Kates |
| 2008/0309441 A1 | 12/2008 | Anderson |
| 2008/0319585 A1 | 12/2008 | Nickerson |
| 2009/0006617 A1 | 1/2009 | Petite |
| 2009/0007706 A1 | 1/2009 | Hitt |
| 2009/0008471 A1 | 1/2009 | Wilson |
| 2009/0008472 A1 | 1/2009 | Wilson |
| 2009/0043427 A1 | 2/2009 | Addink |
| 2009/0068947 A1 | 3/2009 | Petite |
| 2009/0076659 A1 | 3/2009 | Ensworth |
| 2009/0076660 A1 | 3/2009 | Goldberg |
| 2009/0094097 A1 | 4/2009 | Gardenswartz |
| 2009/0096605 A1 | 4/2009 | Petite |
| 2009/0099701 A1 | 4/2009 | Li |
| 2009/0101855 A1 | 4/2009 | Nguyen |
| 2009/0120521 A1 | 5/2009 | Clark |
| 2009/0121049 A1 | 5/2009 | Flynn |
| 2009/0138105 A1 | 5/2009 | Crawford |
| 2009/0138131 A1 | 5/2009 | Uy |
| 2009/0145974 A1 | 6/2009 | Fekete |
| 2009/0150001 A1 | 6/2009 | Fekete |
| 2009/0150002 A1 | 6/2009 | Fekete |
| 2009/0168678 A1 | 7/2009 | Han |
| 2009/0175015 A1* | 7/2009 | Mukouyama ......... H05K 1/148 361/785 |
| 2009/0177330 A1 | 7/2009 | Kah |
| 2009/0204265 A1 | 8/2009 | Hackett |
| 2009/0211096 A1 | 8/2009 | Seitter |
| 2009/0212248 A1 | 8/2009 | Kozak |
| 2009/0215424 A1 | 8/2009 | Petite |
| 2009/0216345 A1 | 8/2009 | Christfort |
| 2009/0217189 A1 | 8/2009 | Martin |
| 2009/0217194 A1 | 8/2009 | Martin |
| 2009/0222140 A1 | 9/2009 | Christiansen |
| 2009/0222141 A1 | 9/2009 | Ensworth |
| 2009/0223128 A1 | 9/2009 | Kuschak |
| 2009/0243840 A1 | 10/2009 | Petite |
| 2009/0267008 A1 | 10/2009 | Lucas |
| 2009/0271045 A1 | 10/2009 | Savelle |
| 2009/0276102 A1 | 11/2009 | Smith |
| 2009/0277506 A1 | 11/2009 | Bradbury |
| 2009/0281672 A1 | 11/2009 | Pourzia |
| 2009/0291575 A1 | 11/2009 | Henry |
| 2009/0292401 A1 | 11/2009 | Kah |
| 2009/0302870 A1 | 12/2009 | Paterson |
| 2009/0308460 A1 | 12/2009 | Tschurtz |
| 2009/0309755 A1 | 12/2009 | Williamson |
| 2009/0326723 A1 | 12/2009 | Moore |
| 2009/0328176 A1 | 12/2009 | Martin |
| 2010/0001223 A1 | 1/2010 | Tschurtz |
| 2010/0004789 A1 | 1/2010 | Savelle |
| 2010/0019181 A1 | 1/2010 | Herbert |
| 2010/0030389 A1 | 2/2010 | Palmer |
| 2010/0030476 A1 | 2/2010 | Woytowitz |
| 2010/0038440 A1 | 2/2010 | Ersavas |
| 2010/0049563 A1 | 2/2010 | Lopez Seco |
| 2010/0059698 A1 | 3/2010 | Guggenmos |

(56) References Cited

U.S. PATENT DOCUMENTS

| | | |
|---|---|---|
| 2010/0078584 A1 | 4/2010 | Van Den Bijgaart et al. |
| 2010/0082169 A1 | 4/2010 | Crist |
| 2010/0082744 A1 | 4/2010 | Raji |
| 2010/0084591 A1 | 4/2010 | Shiao |
| 2010/0094472 A1 | 4/2010 | Woytowitz |
| 2010/0094923 A1 | 4/2010 | Martinez |
| 2010/0095111 A1 | 4/2010 | Gutt |
| 2010/0095369 A1 | 4/2010 | Gutt |
| 2010/0097733 A1 | 4/2010 | E |
| 2010/0100247 A1 | 4/2010 | Nickerson |
| 2010/0109685 A1 | 5/2010 | Morton |
| 2010/0111727 A1 | 5/2010 | Yamagata |
| 2010/0122733 A1 | 5/2010 | Grygus |
| 2010/0123535 A1 | 5/2010 | Yamagata |
| 2010/0131119 A1 | 5/2010 | Brundisini |
| 2010/0145530 A1 | 6/2010 | Nickerson |
| 2010/0145531 A1 | 6/2010 | Nickerson |
| 2010/0147389 A1 | 6/2010 | Blanchard |
| 2010/0152909 A1 | 6/2010 | Hitt |
| 2010/0155638 A1 | 6/2010 | Zurke |
| 2010/0161144 A1 | 6/2010 | Crist |
| 2010/0179701 A1 | 7/2010 | Gilbert |
| 2010/0187457 A1 | 7/2010 | Kratzer |
| 2010/0187458 A1 | 7/2010 | Ueda |
| 2010/0193720 A1 | 8/2010 | Cripps |
| 2010/0194582 A1 | 8/2010 | Petite |
| 2010/0198712 A1 | 8/2010 | Benisti |
| 2010/0218833 A1 | 9/2010 | Bush |
| 2010/0222932 A1 | 9/2010 | O'Connor |
| 2010/0250054 A1 | 9/2010 | Petite |
| 2010/0251807 A1 | 10/2010 | Morton |
| 2010/0252760 A1 | 10/2010 | Hettinger |
| 2010/0252769 A1 | 10/2010 | Goepfert |
| 2010/0256827 A1 | 10/2010 | Bragg |
| 2010/0265909 A1 | 10/2010 | Petite |
| 2010/0268391 A1 | 10/2010 | Anderson |
| 2010/0268392 A1 | 10/2010 | Korol |
| 2010/0269923 A1 | 10/2010 | Parsons |
| 2010/0289411 A1 | 11/2010 | Smits |
| 2010/0294971 A1 | 11/2010 | Elias Najjar |
| 2010/0308245 A1 | 12/2010 | Fink |
| 2010/0312881 A1 | 12/2010 | Davis |
| 2010/0313980 A1 | 12/2010 | Shimizu |
| 2010/0314567 A1 | 12/2010 | Uechi |
| 2010/0324987 A1 | 12/2010 | Benisti |
| 2010/0325005 A1 | 12/2010 | Benisti |
| 2010/0327199 A1 | 12/2010 | Linortner |
| 2011/0001072 A1 | 1/2011 | Tagata |
| 2011/0005481 A1 | 1/2011 | Dinkel |
| 2011/0011783 A1 | 1/2011 | Lippert |
| 2011/0012041 A1 | 1/2011 | De Santis |
| 2011/0015793 A1 | 1/2011 | Crist |
| 2011/0015794 A1 | 1/2011 | Lorenz |
| 2011/0015800 A1 | 1/2011 | Crist |
| 2011/0017845 A1 | 1/2011 | Crist |
| 2011/0024665 A1 | 2/2011 | Hajjar |
| 2011/0035059 A1 | 2/2011 | Ersavas |
| 2011/0035064 A1 | 2/2011 | Kah |
| 2011/0037006 A1 | 2/2011 | Zurke |
| 2011/0040415 A1 | 2/2011 | Nickerson |
| 2011/0040416 A1 | 2/2011 | Nickerson |
| 2011/0042598 A1 | 2/2011 | Kozak |
| 2011/0043230 A1 | 2/2011 | Morton |
| 2011/0049405 A1 | 3/2011 | Bill |
| 2011/0054642 A1 | 3/2011 | Bondar |
| 2011/0057133 A1 | 3/2011 | Nisinosono |
| 2011/0062361 A1 | 3/2011 | Yoshida |
| 2011/0068286 A1 | 3/2011 | Nomichi |
| 2011/0073188 A1 | 3/2011 | Marcus |
| 2011/0073788 A1 | 3/2011 | Marcus |
| 2011/0073791 A1 | 3/2011 | Oikawa |
| 2011/0077785 A1 | 3/2011 | Nickerson |
| 2011/0079740 A1 | 4/2011 | Bill |
| 2011/0080240 A1 | 4/2011 | Patino |
| 2011/0093123 A1 | 4/2011 | Alexanian |
| 2011/0111700 A1 | 5/2011 | Hackett |
| 2011/0121217 A1 | 5/2011 | Ohmi |
| 2011/0147629 A1 | 6/2011 | Gruen |
| 2011/0148552 A1 | 6/2011 | Tomimbang |
| 2011/0148555 A1 | 6/2011 | Sasao |
| 2011/0155934 A1 | 6/2011 | Guler |
| 2011/0168813 A1 | 7/2011 | Bunni |
| 2011/0168929 A1 | 7/2011 | Buestgens |
| 2011/0180464 A1 | 7/2011 | Schmitt |
| 2011/0180736 A1 | 7/2011 | Mangiafico |
| 2011/0186760 A1 | 8/2011 | Michl |
| 2011/0190947 A1 | 8/2011 | Savelle |
| 2011/0190948 A1 | 8/2011 | Fekete |
| 2011/0198522 A1 | 8/2011 | Ambrosi |
| 2011/0204272 A1 | 8/2011 | Kratzer |
| 2011/0212700 A1 | 9/2011 | Petite |
| 2011/0215271 A1 | 9/2011 | Voss |
| 2011/0224836 A1 | 9/2011 | Hern |
| 2011/0227676 A1 | 9/2011 | Cotic |
| 2011/0238228 A1 | 9/2011 | Woytowitz |
| 2011/0248198 A1 | 10/2011 | Huang |
| 2011/0248805 A1 | 10/2011 | Hamaoka |
| 2011/0264324 A1 | 10/2011 | Petite |
| 2011/0270448 A1 | 11/2011 | Kantor |
| 2011/0279576 A1 | 11/2011 | Borra |
| 2011/0279577 A1 | 11/2011 | Borra |
| 2011/0279579 A1 | 11/2011 | Borra |
| 2011/0288690 A1 | 11/2011 | Ensworth |
| 2011/0301767 A1 | 12/2011 | Alexanian |
| 2011/0302708 A1 | 12/2011 | Parsons |
| 2011/0309953 A1 | 12/2011 | Petite |
| 2011/0310929 A1 | 12/2011 | Petite |
| 2011/0320050 A1 | 12/2011 | Petite |
| 2012/0041606 A1 | 2/2012 | Standerfer |
| 2012/0068096 A1 | 3/2012 | Herbert |
| 2012/0072036 A1 | 3/2012 | Piper |
| 2012/0072037 A1 | 3/2012 | Alexanian |
| 2012/0075092 A1 | 3/2012 | Petite |
| 2012/0078425 A1 | 3/2012 | Gardenswartz |
| 2012/0084115 A1 | 4/2012 | Cline |
| 2012/0085950 A1 | 4/2012 | Lorenz |
| 2012/0089259 A1 | 4/2012 | Williams |
| 2012/0089373 A1 | 4/2012 | Hong |
| 2012/0092154 A1 | 4/2012 | Petite |
| 2012/0095604 A1 | 4/2012 | Alexanian |
| 2012/0109387 A1 | 5/2012 | Martin |
| 2012/0132296 A1 | 5/2012 | Parsons |
| 2012/0191261 A1 | 7/2012 | Nickerson |
| 2012/0203383 A1 | 8/2012 | Holindrake |
| 2012/0205568 A1 | 8/2012 | Bush |
| 2012/0214532 A1 | 8/2012 | Petite |
| 2012/0221154 A1 | 8/2012 | Runge |
| 2012/0221718 A1 | 8/2012 | Imes |
| 2012/0222634 A1 | 9/2012 | Dinkel |
| 2012/0232708 A1 | 9/2012 | Ensworth |
| 2012/0239211 A1 | 9/2012 | Walker |
| 2012/0239807 A1 | 9/2012 | Davis |
| 2012/0239808 A1 | 9/2012 | Davis |
| 2012/0253529 A1 | 10/2012 | Carlson |
| 2012/0266095 A1 | 10/2012 | Killian |
| 2012/0273704 A1 | 11/2012 | O'Connor |
| 2012/0290139 A1 | 11/2012 | Brundisini |
| 2012/0290140 A1 | 11/2012 | Groeneveld |
| 2012/0303168 A1 | 11/2012 | Halahan |
| 2012/0303169 A1 | 11/2012 | Crist |
| 2013/0002012 A1 | 1/2013 | Korol |
| 2013/0008542 A1* | 1/2013 | Irwin .................. F16K 31/402 137/859 |
| 2013/0025721 A1 | 1/2013 | Yun |
| 2013/0035774 A1 | 2/2013 | Warren |
| 2013/0048746 A1 | 2/2013 | Littrell |
| 2013/0060389 A1 | 3/2013 | Marsters |
| 2013/0061380 A1 | 3/2013 | Parsons |
| 2013/0061381 A1 | 3/2013 | Parsons |
| 2013/0063231 A1 | 3/2013 | Tomimbang |
| 2013/0085619 A1 | 4/2013 | Howard |
| 2013/0110293 A1 | 5/2013 | Illig |
| 2013/0116837 A1 | 5/2013 | Malaugh |
| 2013/0131874 A1 | 5/2013 | Shupe |

(56) References Cited

U.S. PATENT DOCUMENTS

| | | |
|---|---|---|
| 2013/0162390 A1 | 6/2013 | Ersavas |
| 2013/0173070 A1 | 7/2013 | Tennyson |
| 2013/0190934 A1 | 7/2013 | Holindrake |
| 2013/0207771 A1 | 8/2013 | Ersavas |
| 2013/0226357 A1 | 8/2013 | Ersavas |
| 2013/0264506 A1 | 10/2013 | Schnelker |
| 2013/0264507 A1 | 10/2013 | Schnelker |
| 2013/0274932 A1 | 10/2013 | Curren |
| 2013/0284960 A1 | 10/2013 | Schnelker |
| 2013/0297082 A1 | 11/2013 | Ensworth |
| 2013/0306891 A1 | 11/2013 | Fietz |
| 2013/0310992 A1 | 11/2013 | Larsen |
| 2013/0318231 A1 | 11/2013 | Raji |
| 2014/0005810 A1 | 1/2014 | Frei |
| 2014/0005843 A1 | 1/2014 | Thomas |
| 2014/0005851 A1 | 1/2014 | Frei |
| 2014/0006506 A1 | 1/2014 | Frei |
| 2014/0018965 A1 | 1/2014 | Pearson |
| 2014/0020379 A1 | 1/2014 | Steinman |
| 2014/0020663 A1 | 1/2014 | Pifer |
| 2014/0039696 A1 | 2/2014 | Andrews |
| 2014/0039698 A1 | 2/2014 | Crist |
| 2014/0081471 A1 | 3/2014 | Woytowitz |
| 2014/0084194 A1 | 3/2014 | Kibune |
| 2014/0088770 A1 | 3/2014 | Masters |
| 2014/0124044 A1 | 5/2014 | Garcia |
| 2014/0129039 A1 | 5/2014 | Olive-Chahinian |
| 2014/0143397 A1 | 5/2014 | Gutt |
| 2014/0172180 A1 | 6/2014 | Woytowitz |
| 2014/0203200 A1 | 7/2014 | Da Silva |
| 2014/0222223 A1 | 8/2014 | Horton |
| 2014/0229024 A1 | 8/2014 | Wang |
| 2014/0236868 A1 | 8/2014 | Cook |
| 2014/0239211 A1 | 8/2014 | Morgan |
| 2014/0245160 A1 | 8/2014 | Bauer |
| 2014/0258474 A1 | 9/2014 | Kim |
| 2014/0264114 A1 | 9/2014 | Farace |
| 2014/0297049 A1 | 10/2014 | Lorenz |
| 2014/0361206 A1 | 12/2014 | Holmes |
| 2014/0367595 A1 | 12/2014 | Miura |
| 2014/0371928 A1 | 12/2014 | Ersavas |
| 2014/0374512 A1 | 12/2014 | Honjo |
| 2015/0005965 A1 | 1/2015 | Ensworth |
| 2015/0019031 A1 | 1/2015 | Crist |
| 2015/0047897 A1 | 2/2015 | Zimet |
| 2015/0088324 A1 | 3/2015 | Crist |
| 2015/0102243 A1 | 4/2015 | Timmermans |
| 2015/0147119 A1 | 5/2015 | Christiansen |
| 2015/0279538 A1 | 10/2015 | Toda |
| 2015/0280541 A1 | 10/2015 | Ando |
| 2015/0357733 A1* | 12/2015 | Sanford ............ H01R 12/62 361/749 |
| 2015/0380143 A1 | 12/2015 | Saiki |
| 2016/0092600 A1 | 3/2016 | Chan |
| 2016/0113219 A1 | 4/2016 | Tennyson |
| 2016/0113220 A1 | 4/2016 | Walker |
| 2016/0123490 A1 | 5/2016 | McLauchlan |
| 2016/0135389 A1 | 5/2016 | Ersavas |
| 2016/0157446 A1 | 6/2016 | Bentwich |
| 2016/0198646 A1 | 7/2016 | Ensworth |
| 2016/0295819 A1 | 10/2016 | Porter |
| 2017/0081028 A1 | 3/2017 | Jones |
| 2017/0094918 A1 | 4/2017 | Crist |
| 2017/0191580 A1 | 7/2017 | Pifer |
| 2017/0223911 A1 | 8/2017 | Lorenz |
| 2017/0234445 A1 | 8/2017 | Watanabe |
| 2017/0322527 A1 | 11/2017 | Ersavas |
| 2017/0367277 A1 | 12/2017 | Mohindra |
| 2017/0370495 A1 | 12/2017 | Markley |
| 2018/0231139 A1 | 8/2018 | Morgan |
| 2018/0279566 A1* | 10/2018 | Wlassich ............ A01G 25/162 |
| 2018/0332784 A1 | 11/2018 | Crist |
| 2018/0338436 A1 | 11/2018 | Crist |
| 2018/0341764 A1 | 11/2018 | Chou |
| 2018/0368261 A1 | 12/2018 | Kwak |
| 2019/0078543 A1 | 3/2019 | Yamazaki |
| 2019/0116743 A1 | 4/2019 | Ensworth |
| 2019/0150381 A1 | 5/2019 | Tennyson |
| 2019/0307084 A1 | 10/2019 | Ersavas |
| 2019/0313590 A1 | 10/2019 | Wlassich |
| 2019/0327920 A1 | 10/2019 | Lorenz |
| 2020/0238321 A1 | 7/2020 | Lichte |
| 2020/0245574 A1 | 8/2020 | Woytowitz |

FOREIGN PATENT DOCUMENTS

| | | |
|---|---|---|
| CN | 1511383 | 7/2004 |
| CN | 101021729 A | 8/2007 |
| CN | 101849494 A | 10/2010 |
| CN | 102483628 A | 5/2012 |
| CN | 101849494 B | 11/2014 |
| CN | 102483628 B | 3/2016 |
| DE | 102011055586 A1 | 5/2013 |
| EP | 0748584 A1 | 12/1996 |
| EP | 1324166 A2 | 7/2003 |
| EP | 1763990 A2 | 3/2007 |
| EP | 1798907 | 6/2007 |
| EP | 2215906 A1 | 8/2010 |
| EP | 2281445 | 2/2011 |
| EP | 2281445 A2 | 2/2011 |
| EP | 3010027 A2 | 4/2016 |
| EP | 3301692 A1 | 4/2018 |
| ES | 2209614 A1 | 6/2004 |
| GB | 2177582 A | 1/1987 |
| JP | 2010034223 A | 2/2010 |
| TR | 200900883 A2 | 2/2009 |
| TR | 200805998 A2 | 12/2009 |
| WO | 8606579 A1 | 11/1986 |
| WO | 9708942 A1 | 3/1997 |
| WO | 1999039567 | 8/1999 |
| WO | 2001095277 | 12/2001 |
| WO | 0235193 A2 | 5/2002 |
| WO | 02058254 A1 | 7/2002 |
| WO | 2004040415 A2 | 5/2004 |
| WO | 2005002321 A2 | 1/2005 |
| WO | 2007104152 A2 | 9/2007 |
| WO | 2007131169 | 11/2007 |
| WO | 2009132425 A1 | 11/2009 |
| WO | 2010019109 | 2/2010 |
| WO | 2011017059 A2 | 2/2011 |
| WO | 2011044289 | 4/2011 |
| WO | 2011044289 A1 | 4/2011 |
| WO | 2012153893 A1 | 11/2012 |
| WO | 2016007159 A1 | 1/2016 |
| WO | 2016027506 A1 | 2/2016 |
| WO | 2019211820 A1 | 11/2019 |

OTHER PUBLICATIONS

Sierra Circuits, Flex & Rigid-Flex PCBs, [online]. Retrieved from the Internet: <URL: https://web.archive.org/web/20150919031553/https://www.protoexpress.com/flex-pcb>, 3 pages. Publicly available before Jun. 13, 2018.

Sierra Circuits, Flex PCBs: Design Guide, 26 pages. Publicly available before Jun. 13, 2018.

Rain Bird Corporation IC System Design Guide v 23, updated Aug. 2016, 21 pages.

Rain Bird Corporation IC System Operation and Troubleshooting Guide, Jul. 2009, 27 pages.

Rain Bird Corporation, IC System Installation Guide, Jul. 2009, 19 pages.

'PureSense on-line help', https://www.pserm.com/IrrigationManagerHelp/PureSense_Irrigation_Manager.htm, Mar. 24, 2010.

Akyildiz et al., "Wireless sensor networks: A survey," Computer Networks 38 (2002) 393-422.

EPO; App. No. 06018783.8; Extended European Search Report dated Nov. 5, 2012; 14 pages.

EPO; App. No. 10 170 920; Exam Report dated Dec. 19, 2012; 6 pages.

(56) References Cited

OTHER PUBLICATIONS

EPO; App. No. 10822643.2; Extended European Search Report dated Nov. 17, 2014.
EPO; App. No. EP 06018783; Supplementary Partial European Search Report dated Dec. 15, 2011; 7 pages.
EPO; App. No. EP 10170920.2; European Search Report dated Mar. 8, 2012; 7 pages.
EPO; App. No. EP09180196; Extended European Search Report dated Apr. 9, 2010; 7 pages.
European Patent Office, Extended European Search Report for European Application No. 17177629.7 dated Nov. 8, 2017, 8 pages.
Intel, "Instrumenting the World: An Introduction to Wireless Sensor Networks," Version 1, Feb. 2004.
Li, "Study on Precision Agriculture Monitoring Framework Based on WSN," Anti-counterfeiting, Security, and Identification, 2nd International Conference, 2008, 182-185.
Microchip Technology Inc.; PIC/16F631/677/685/687,689/690 Data Sheet; 20-Pin Flash-Based, 8-Bit CMOS Microcontrollers with Nano Watt Technology; 2006; 294 pages.
Nokia, "Machine-to-Machine," White Paper (2004).
PCT; App. No. PCT/TR2009/000103; International Report on Patentability dated Feb. 24, 2011.
PCT; App. No. PCT/TR2009/000103; International Search Report dated Feb. 1, 2010.
PCT; App. No. PCT/TR2009/000103; Written Opinion dated Feb. 12, 2011.
PCT; App. No. PCT/US2010/043273; International Search Report dated Mar. 2, 2011; 3 pages.
PCT; App. No. PCT/US2010/043273; Written Opinion of the International Searching Authority dated Mar. 2, 2011; 3 pages.
PCT; International Search Report corresponding to International Application No. PCT/ US2007/068242; dated Jul. 28, 2008; 4 pages.
PCT; International Search Report corresponding to International Application No. PCT/ US2010/051699; dated Nov. 30, 2010; 2 pages.
PCT; Written Opinion of the International Searching Authority corresponding to International Application No. PCT/US2010/051699; dated Nov. 30, 2010; 8 pages.
Rain Bird, 'FD Field Decoders: Rain Bird Decoders', Feb. 17, 2005, pp. 1-4, printed from www.rainbird.com/golf/products/centralcontrol/decoders.htm, Rain Bird Corporation, Glendora, CA.
Rain Bird, 'Full/Part Circle Roters', Oct. 2004, pp. 1-4, Catalog No. 438, Rain Bird Corporation, Glendora, CA.
Rain Bird, 'Tech Specs: Rain Bird Decoders', Oct. 2004, Rain Bird Corporation Golf Division, Tucson, AZ; 2 pages.
Rain Bird, "Master Parts Book 2008-2009", Jan. 2008, pp. 129-130, 140, Rain Bird Corporation, Parts and Service Center, Azusa, CA.
Rain Bird, "Maxicom2 Decoders: Sensor-Pulse", Sep., 2002, pp. 1-2, Rain Bird Corporation, Azusa, CA.
Rain Bird, "Rain Bird Latching Solenoid: Part No. 231831", 1999, Rain Bird Corporation, Tucson, AZ, 1 page.
Rain Bird, "Rain Bird MDC Decoder-based Control System", Jan., 2006, pp. 1-4, Rain Bird Corporation, Azusa, CA.
SIPO; App. No. 200911000193.6; Office Action dated Nov. 5, 2012; 23 pages.
SIPO; App. No. 201080037966.2; Office Action and partial summary translation provided by Chinese Associate dated Jan. 6, 2014; 6 pages.
SIPO; App. No. 201080037966.2; Office Action dated Sep. 3, 2014; 14 pages.
The Toro Company; "Golf Decoder Control System (GDC)"; http://web.archive.org/ web/20070625035525/www.toro.com/irrigation/golf/Igturffield/gddindex.html; Available at least as early as Jun. 25, 2007, pp. 66.
U.S. Appl. No. 16/992,962, filed Aug. 13, 2020, Michael James Tennyson et al., entitled Wireless Irrigation Control.
USPTO, U.S. Appl. No. 09/592,907 filed Jun. 13, 2000, entitled "Canister Purge Valve for High Regeneration Airflow," abandoned.
USPTO; U.S. Appl. No. 13/844,304; Office Action dated Oct. 16, 2015.
USPTO; U.S. Appl. No. 13/500,882; Office Action dated Dec. 18, 2014.
USPTO; U.S. Appl. No. 11/228,413; Examiner Interview Summary dated Apr. 22, 2009; 2 pages.
USPTO; U.S. Appl. No. 11/228,413; Examiner Interview Summary mailed Dec. 7, 2009; 2 pages.
USPTO; U.S. Appl. No. 11/228,413; Notice of Allowance dated Jun. 18, 2010; 8 pages.
USPTO; U.S. Appl. No. 11/228,413; Notice of Panel Decision from Pre-Appeal Brief Review dated Apr. 28, 2010; 2 pages.
USPTO; U.S. Appl. No. 11/228,413; Office Action dated Apr. 2, 2008; 12 pages.
USPTO; U.S. Appl. No. 11/228,413; Office Action dated May 20, 2009; 10 pages.
USPTO; U.S. Appl. No. 11/228,413; Office Action dated Dec. 2, 2008; 9 pages.
USPTO; U.S. Appl. No. 11/228,413; Office Action dated Dec. 7, 2009; 12 pages.
USPTO; U.S. Appl. No. 11/228,413; Supplemental Notice of Allowance dated Aug. 5, 2010; 4 pages.
USPTO; U.S. Appl. No. 11/228,413; Supplemental Notice of Allowance dated Sep. 2, 2010; 4 pages.
USPTO; U.S. Appl. No. 12/505,397; Office Action dated Feb. 13, 2013; 16 pages.
USPTO; U.S. Appl. No. 12/505,401; Notice of Allowance dated May 7, 2012; 5 pages.
USPTO; U.S. Appl. No. 12/505,401; Office Action dated Oct. 31, 2011; 14 pages.
USPTO; U.S. Appl. No. 12/510,111; Notice of Allowance dated Apr. 2, 2014; 12 pages.
USPTO; U.S. Appl. No. 12/510,111; Notice of Allowance dated May 16, 2014; 9 pages.
USPTO; U.S. Appl. No. 12/510,111; Office Action dated Jun. 4, 2013; 22 pages.
USPTO; U.S. Appl. No. 12/510,111; Office Action dated Oct. 16, 2012; 12 pages.
USPTO; U.S. Appl. No. 12/510,111; Office Action dated Dec. 27, 2013; 18 pages.
USPTO; U.S. Appl. No. 12/510,111; Office Action dated Feb. 29, 2012; 21 pages.
USPTO; U.S. Appl. No. 12/510,118; Notice of Allowance dated Apr. 2, 2014; 5 pages.
USPTO; U.S. Appl. No. 12/510,118; Notice of Allowance dated May 16, 2014; 9 pages.
USPTO; U.S. Appl. No. 12/510,118; Office Action dated Jun. 5, 2013; 20 pages.
USPTO; U.S. Appl. No. 12/510,118; Office Action dated Oct. 16, 2012; 15 pages.
USPTO; U.S. Appl. No. 12/510,118; Office Action dated Dec. 30, 2013; 17 pages.
USPTO; U.S. Appl. No. 12/510,118; Office Action dated Feb. 29, 2012; 21 pages.
USPTO; U.S. Appl. No. 12/537,772; Office Action dated Mar. 21, 2013.
USPTO; U.S. Appl. No. 12/537,772; Office Action dated Dec. 29, 2011.
USPTO; U.S. Appl. No. 12/849,488; Notice of Allowance dated Feb. 22, 2013.
USPTO; U.S. Appl. No. 12/849,488; Notice of Allowance dated Jul. 3, 2013.
USPTO; U.S. Appl. No. 12/849,488; Notice of Allowance dated Oct. 28, 2013.
USPTO; U.S. Appl. No. 12/849,488; Office Action dated Jun. 22, 2012.
USPTO; U.S. Appl. No. 12/866,471; Office Action dated Mar. 17, 2011; 18 pages.
USPTO; U.S. Appl. No. 12/886,471; Notice of Allowance dated Sep. 20, 2011; 7 pages.
USPTO; U.S. Appl. No. 12/886,471; Supplemental Notice of Allowance dated Oct. 19, 2011; 3 pages.

(56) References Cited

OTHER PUBLICATIONS

USPTO; U.S. Appl. No. 13/151,269; Office Action dated Jan. 18, 2012.
USPTO; U.S. Appl. No. 13/332,337; Notice of Allowance dated Mar. 13, 2014; 11 pages.
USPTO; U.S. Appl. No. 13/332,337; Notice of Allowance dated Dec. 6, 2013; 11 pages.
USPTO; U.S. Appl. No. 13/500,882; Notice of Allowance dated Oct. 5, 2015.
USPTO; U.S. Appl. No. 13/500,882; Office Action dated Apr. 3, 2015.
USPTO; U.S. Appl. No. 13/532,557; Notice of Allowance dated Apr. 4, 2017.
USPTO; U.S. Appl. No. 13/532,557; Notice of Allowance dated Jul. 31, 2017; (pp. 1-8).
USPTO; U.S. Appl. No. 13/532,557; Office Action dated Sep. 9, 2016.
USPTO; U.S. Appl. No. 13/532,557; Office Action dated Jan. 2, 2015.
USPTO; U.S. Appl. No. 13/532,557; Office Action dated Oct. 15, 2015.
USPTO; U.S. Appl. No. 13/570,139; Notice of Allowance dated May 9, 2013; 15 pages.
USPTO; U.S. Appl. No. 13/570,139; Office Action dated Dec. 26, 2012; 8 pages.
USPTO; U.S. Appl. No. 13/844,248; Notice of Allowance dated May 22, 2014, 2014.
USPTO; U.S. Appl. No. 13/844,304; Notice of Allowance dated Mar. 6, 2017.
USPTO; U.S. Appl. No. 13/844,304; Office Action dated Oct. 3, 2016.
USPTO; U.S. Appl. No. 13/844,304; Office Action dated Dec. 30, 2014.
USPTO; U.S. Appl. No. 13/963,966; Notice of Allowance dated Aug. 6, 2014; 7 pages.
USPTO; U.S. Appl. No. 13/963,966; Office Action dated Feb. 6, 2014; 16 pages.
USPTO; U.S. Appl. No. 14/304,502; Notice of Allowance dated Jan. 27, 2017; 8 pages.
USPTO; U.S. Appl. No. 14/304,502; Office Action dated Jul. 12, 2016; 12 pages.
USPTO; U.S. Appl. No. 14/466,469; Notice of Allowance dated Sep. 11, 2015.
USPTO; U.S. Appl. No. 14/466,469; Office Action dated Dec. 29, 2014.
USPTO; U.S. Appl. No. 14/493,106; Application filed Sep. 22, 2014, entitled "Integrated Control Circuitry and Coil Assembly for Irrigation Control," (57 pages).
USPTO; U.S. Appl. No. 14/493,106; Notice of Allowance dated Apr. 30, 2018.
USPTO; U.S. Appl. No. 14/493,106; Office Action dated Apr. 21, 2016; 14 pages.
USPTO; U.S. Appl. No. 14/493,106; Office Action dated Sep. 22, 2017.
USPTO; U.S. Appl. No. 14/493,106; Office Action dated Oct. 11, 2016; 9 pages.
USPTO; U.S. Appl. No. 14/507,751; Application filed Oct. 6, 2014, entitled "Integrated Control Circuitry and Coil Assembly for Irrigation Control," (57 pages).
USPTO; U.S. Appl. No. 14/507,751; Notice of Allowance dated Feb. 21, 2017; 8 pages.
USPTO; U.S. Appl. No. 14/507,751; Notice of Allowance dated Oct. 12, 2016; 6 pages.
USPTO; U.S. Appl. No. 14/507,751; Office Action dated Apr. 19, 2016; 14 pages.
USPTO; U.S. Appl. No. 14/970,349; Notice of Allowance dated Mar. 25, 2019; (pp. 1-10).
USPTO; U.S. Appl. No. 14/970,349; Notice of Allowance dated Oct. 2, 2018; (pp. 1-9).
USPTO; U.S. Appl. No. 14/970,349; Office Action dated Feb. 8, 2018; (pp. 1-10).
USPTO; U.S. Appl. No. 14/989,771; Notice of Allowance dated Sep. 13, 2018.
USPTO; U.S. Appl. No. 14/989,771; Office Action dated Feb. 22, 2018.
USPTO; U.S. Appl. No. 15/380,816; Notice of Allowance dated May 18, 2018.
USPTO; U.S. Appl. No. 15/380,816; Office Action dated Dec. 5, 2017.
USPTO; U.S. Appl. No. 15/499,620; Notice of Allowance dated Apr. 9, 2019; 7 pages.
USPTO; U.S. Appl. No. 15/499,620; Office Action dated Dec. 13, 2018; 7 pages.
USPTO; U.S. Appl. No. 15/616,736; Application filed Jun. 7, 2017, entitled "Methods and Systems for Irrigation and Climate Control," (77 pages).
USPTO; U.S. Appl. No. 15/616,736; Office Action dated Feb. 20, 2020; (pp. 1-15).
USPTO; U.S. Appl. No. 15/631,191; Notice of Allowance dated Jul. 16, 2020, (pp. 1-8).
USPTO; U.S. Appl. No. 15/631,191; Notice of Allowance dated Oct. 27, 2020; (pp. 1-7).
USPTO; U.S. Appl. No. 15/631,191; Office Action dated Jan. 29, 2020; (pp. 1-9).
USPTO; U.S. Appl. No. 15/631,191; Office Action dated May 7, 2020, (pp. 1-10).
USPTO; U.S. Appl. No. 15/631,191; Office Action dated Jun. 11, 2020, (pp. 1-8).
USPTO; U.S. Appl. No. 15/631,191; Office Action dated Oct. 22, 2019; (pp. 1-13).
USPTO; U.S. Appl. No. 15/937,267; Office Action dated Jul. 6, 2020, (pp. 1-18).
USPTO; U.S. Appl. No. 15/937,267; Office Action dated Nov. 1, 2019; (pp. 1-17).
USPTO; App. No. 16/052,471; Office Action dated Jan. 13, 2020; (pp. 1-15).
USPTO; U.S. Appl. No. 16/049,568; Office Action dated Jan. 13, 2020; (pp. 1-15).
USPTO; U.S. Appl. No. 16/452,397; Notice of Allowance dated Mar. 11, 2020; (pp. 1-9).
USPTO: U.S. Appl. No. 15/616,736; Office Action dated May 29, 2019; (pp. 1-16).
USPTO; U.S. Appl. No. 14/493,106; Office Action dated Apr. 11, 2017; 11 pages.
Williamson; U.S. Provisional Patent Application No. 60/797,540; filed May 4, 2006; 13 pages.
Zigbee, 'Zigbee Resource Guide—Spring 2008,' 2008, pp. 28-31, Fourier Systems Ltd., New Albany, IN.
Zigbee; 'Zigbee Resource Guide—Spring 2008;' 2008; pp. 1-32; Fourier Systems Ltd.; New Albany, IN.
USPTO; U.S. Appl. No. 15/937,267; Office Action dated Dec. 11, 2020; (pp. 1-22).
USPTO; U.S. Appl. No. 15/616,736; Office Action dated Feb. 1, 2021; (pp. 1-16).

* cited by examiner

Prior Art

US 10,980,120 B2

COMPACT PRINTED CIRCUIT BOARD

CROSS-REFERENCE

This application claims the benefit of U.S. Provisional Application No. 62/519,985, filed Jun. 15, 2017, which application is hereby incorporated herein by reference in its entirety.

FIELD

The subject matter of this application relates to printed circuit boards and, more particularly, to a compact printed circuit board for integration with a solenoid used to control irrigation valves.

BACKGROUND

Irrigation systems are primarily used in the monitoring and controlling of watering of vegetation, such as landscapes, gardens, golf courses, municipal parks, and sports venues. Irrigation systems include valves, wires, pipes, sensors, controllers, and water emission devices (e.g., sprinklers, drip emitters, and dripline). Modern day irrigation systems use integrated circuits to facilitate communication between various aspects of an irrigation system, such as between a controller and a solenoid.

Valves are typically controlled electronically by a solenoid. Valves can be standalone valves that control flow through the irrigation piping or can be integrated into the sprinklers so that water flow is controlled at the sprinkler. Solenoids are typically wired to a controller, and the power and signal to actuate them is transmitted via the wires. In some cases, the wires are attached to a printed circuit board on or near a solenoid. The controllers include schedules that communicate through the wires to the printed circuit board connected to the solenoid to turn on and off the valves for controlling irrigation. In some instances, the printed circuit board can decode the signal to determine whether the signal is for that particular solenoid. If it is, watering is enabled, and if not, then the signal is ignored.

Printed circuit boards contain micro-electronics required for enabling functionality at a valve. Printed circuit boards can often be relatively large to accommodate the requisite micro-electronics. Printed circuit boards have been housed near or on a solenoid in an enclosure. It is desired to have a more compact configuration for the printed circuit board without sacrificing the functionality and being able to add additional performance capabilities. Such a compactified printed circuit board results in easier association of the printed circuit board with a solenoid.

DETAILED DESCRIPTION

Figure 1:
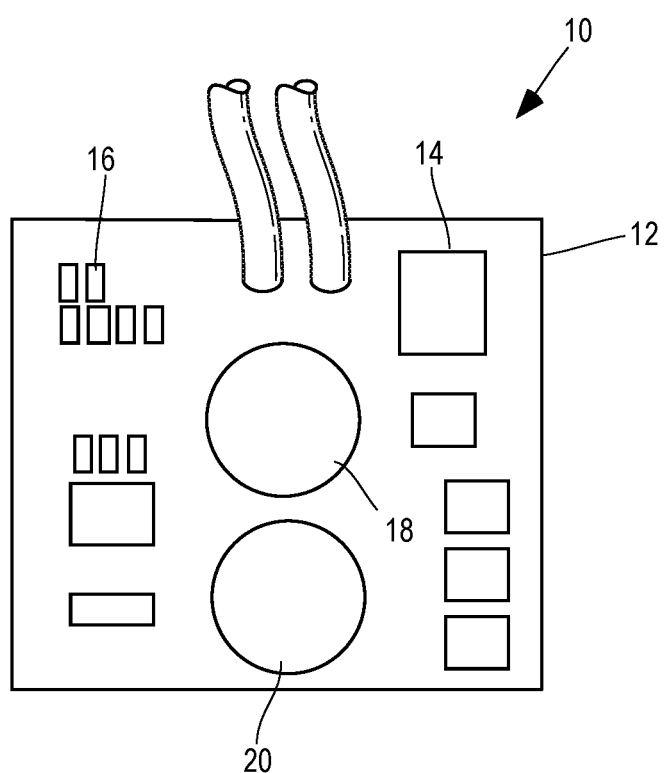
FIG. 1 is a plan view of a prior art printed circuit board for controlling functionality at a valve.

With reference to FIG. 1, there is illustrated a prior printed circuit board 10. The printed circuit board 10 may include a rigid board 12 with integrated micro-electronics, such as a lightning protection component 14, signal conditioning circuits 16, energy storage devices 18 and 20, and a micro-controller (on the opposite side). Printed circuit boards, such as printed circuit board 10, are used in irrigation systems. In an irrigation system, a controller communicates with the micro-electronics of the printed circuit board at a valve or sprinkler to activate and control the amount and frequency of watering. The controller sends a watering signal along the wiring (e.g., a 24 AC power line) to a valve or sprinkler to be activated. For example, the printed circuit board 10 may be attached to a solenoid at the valve or sprinkler. The printed circuit board may decode the signal to determine whether the signal is for that solenoid to cause activation. When the solenoid is activated, it functions to open the valve.

Figure 2:
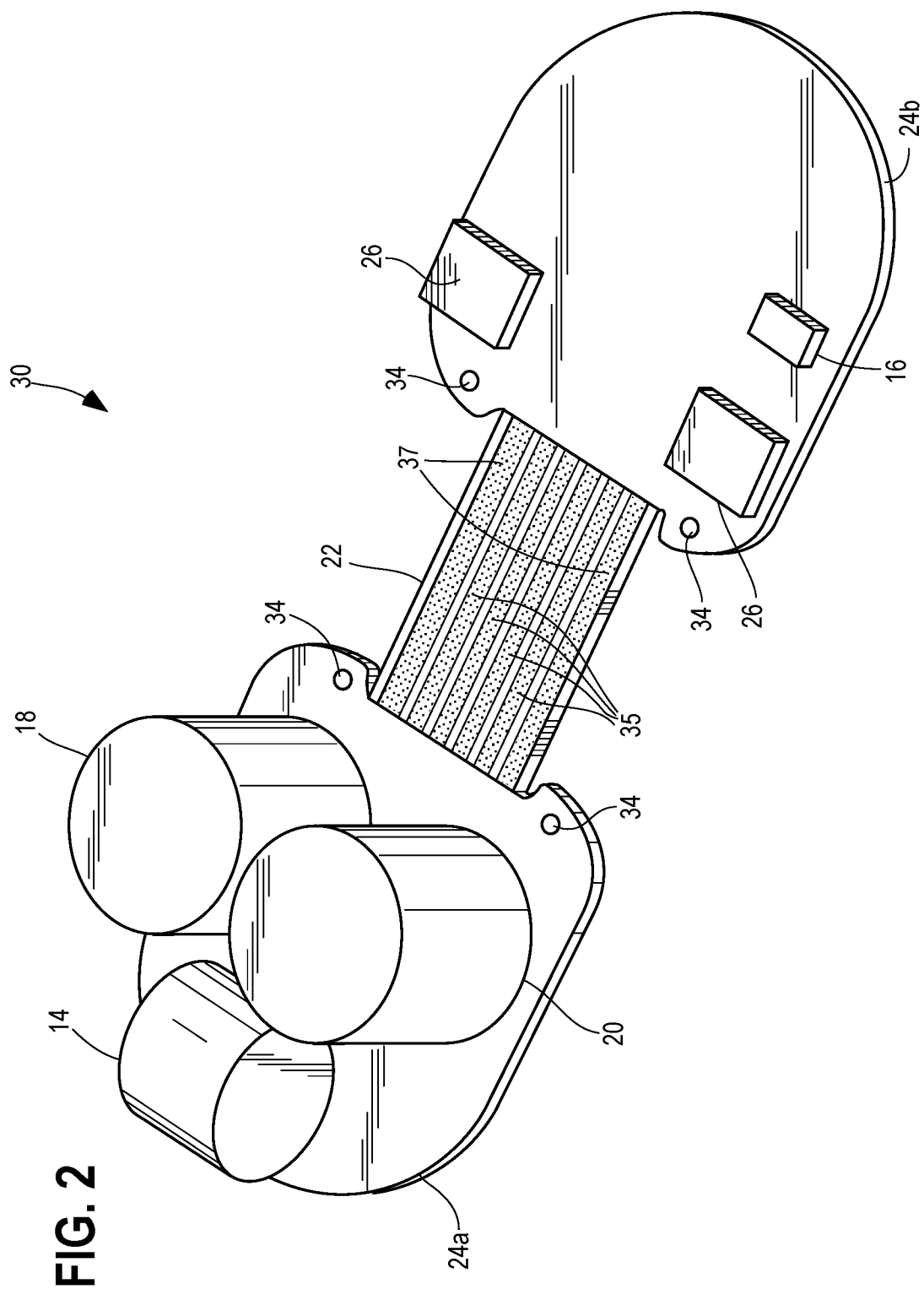
FIG. 2 is a top perspective view of a printed circuit board for controlling functionality at a valve embodying features of the present invention.

Printed circuit boards have been found to take up too much space, so it is desirable to have configurations that decrease size without sacrificing capabilities. FIG. 2 is a printed circuit board 30 in an alternative configuration to the printed circuit board 10 of FIG. 1. The printed circuit board 30 takes on a dumbbell-like shape. The printed circuit board 30 includes two smaller boards 24a,b connected by a flexible rigid board connector 22. The flexible connector 22 enables the smaller boards 24a,b to be folded on top of one another which produces a smaller footprint while retaining the same micro-electronics and functionality as the larger printed circuit board 10 of FIG. 1.

A 3-dimensional distribution of the circuitry by folding of the printed circuit board 30 may allow room for additional micro-electronic features, such as wireless and sensor technologies, to be included on the printed circuit board 30. For example, a transceiver may be included and may operate using any conventional wireless communication technology, such as WiFi, Low Energy Bluetooth, Zigbee, Z-Wave, and Insteon. The transceiver could enable the solenoid to be part of a communication network, such as a mesh network. Alternatively, the printed circuit board 30 could include a motion, temperature, humidity, solar radiation, light or other common sensor. Data from these sensors can be communicated back to the controller for processing, such as to adjust watering schedules or provide various alerts, via a wired or wireless communication connection.

The flexible connector 22 may consist of copper clad flexible dielectrics, such as polyimide film constructed with an adhesive, while epoxy-based material may be used for construction of the rigid boards 24a,b.

The printed circuit board 30 may also have etched circuitry trace solder pads instead of soldered hand-wired connections of previous rigid circuit boards, eliminating costs and wiring errors. Furthermore, production of printed circuit boards with flexible connectors, such as printed circuit board 30, require less manual labor and have a reduced probability of production malfunctions. Circuit boards, such as printed circuit board 30, can be installed or replaced as completely fabricated interconnection systems, rather than having to install or replace individual rigid printed circuit boards that require reconnection to other boards. This also greatly eliminates wiring errors and reduces manufacturing costs.

In addition, connected at each end of the flexible connector 22 are the boards 24a,b. The flexible rigid board connector 22 may consist of multiple layers of flexible circuit substrate polyimide film with adhesives. The connection of the flexible rigid board connector to the rigid boards 24a,b is done internally through metallization connection vias. Each board 24a,b can have the same shape or different shapes to one another. Each board 24a,b has holes 34 for connection to a solenoid enclosure. For example, pins 43 (see FIG. 4) may be inserted through the holes 34 and soldered to a solenoid enclosure. The boards contain various micro-electronics depending on the required functionality. For example, rigid board 24a contains the lightning protection component 14, the energy storage devices 18 and 20. Rigid board 24b includes an H-Bridge driver 26 and the signal conditioning circuits 16.

Figure 3:
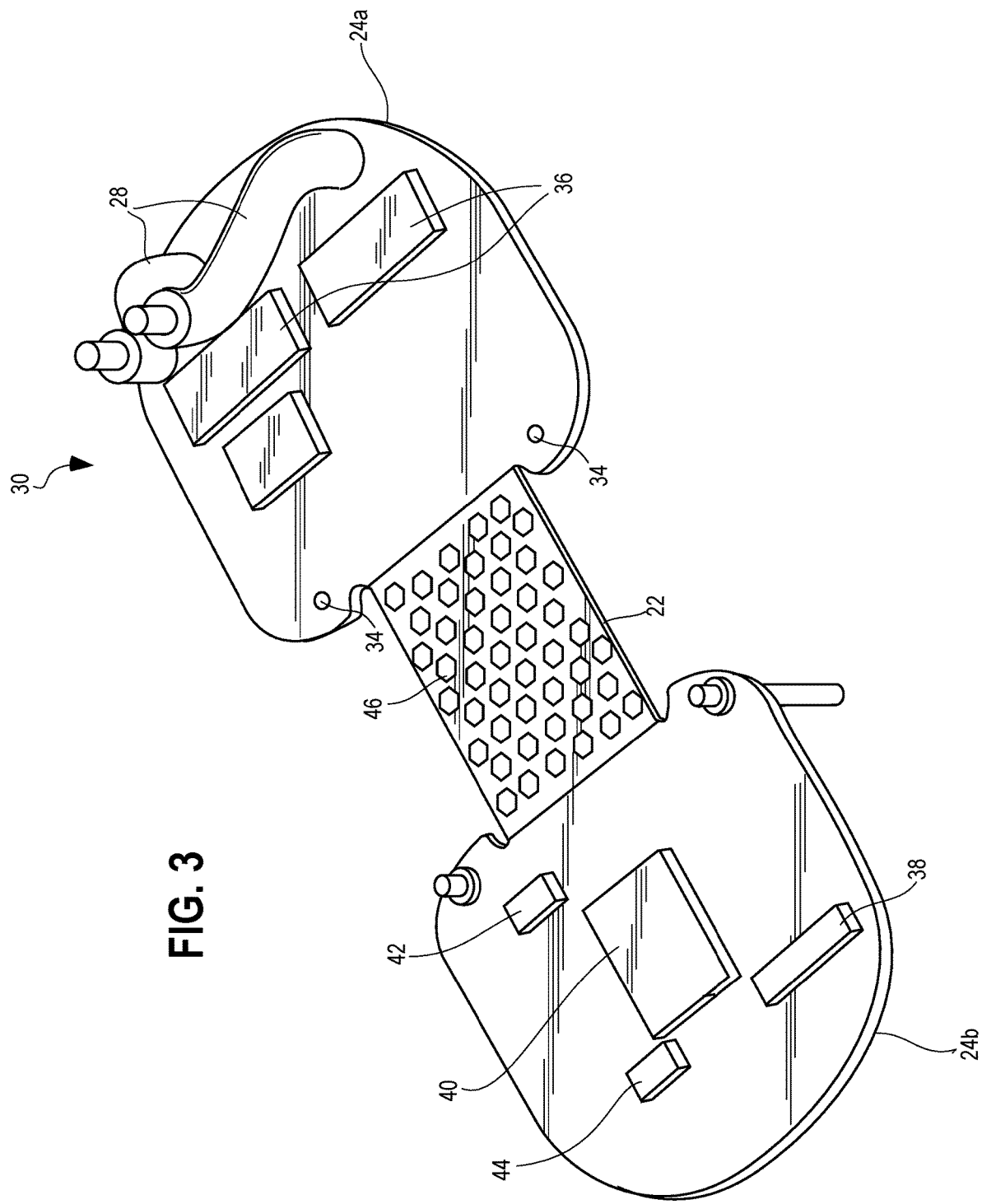
FIG. 3 is a bottom perspective view of the printed circuit board of FIG. 2.

FIG. 3 is the reverse side of the printed circuit board 30 of FIG. 2. The back side of rigid board 24a has the control wiring 28, such as from a controller, attached thereto, and may contain load resistors 36. The back side of rigid board 24b may contain a crystal oscillator 38, a micro-controller 40, a voltage regulator 42, and an input signal device 44.

The preferred flexible rigid board connector 22 includes a ground back layer 46 as a shield and four control lines 35 and two driver output interconnection traces 37 for the solenoid. The flexible rigid connector alternatively could have additional lines as needed.

The micro-controller 40 and the crystal oscillator 38 coordinate the control request of a remote host and can trigger solenoid commands, sense power line conditions, and communicate the status of the module. The input signal device 44 provides the signal conditioning to interface with the micro-controller 40. The H-Bridge driver 26 enables the micro-controller 40 to control the latched or unlatched state of a latching type solenoid. The voltage regulator 42 regulates the power for a circuit module. The energy storage devices 18 and 20 may be capacitors of energy reservoirs used to latch/un-latch a solenoid and may also function as back-up energy for un-latching a solenoid in the case of power failure. The circuit board 30 also can be used with a non-latching solenoid.

Figure 4:
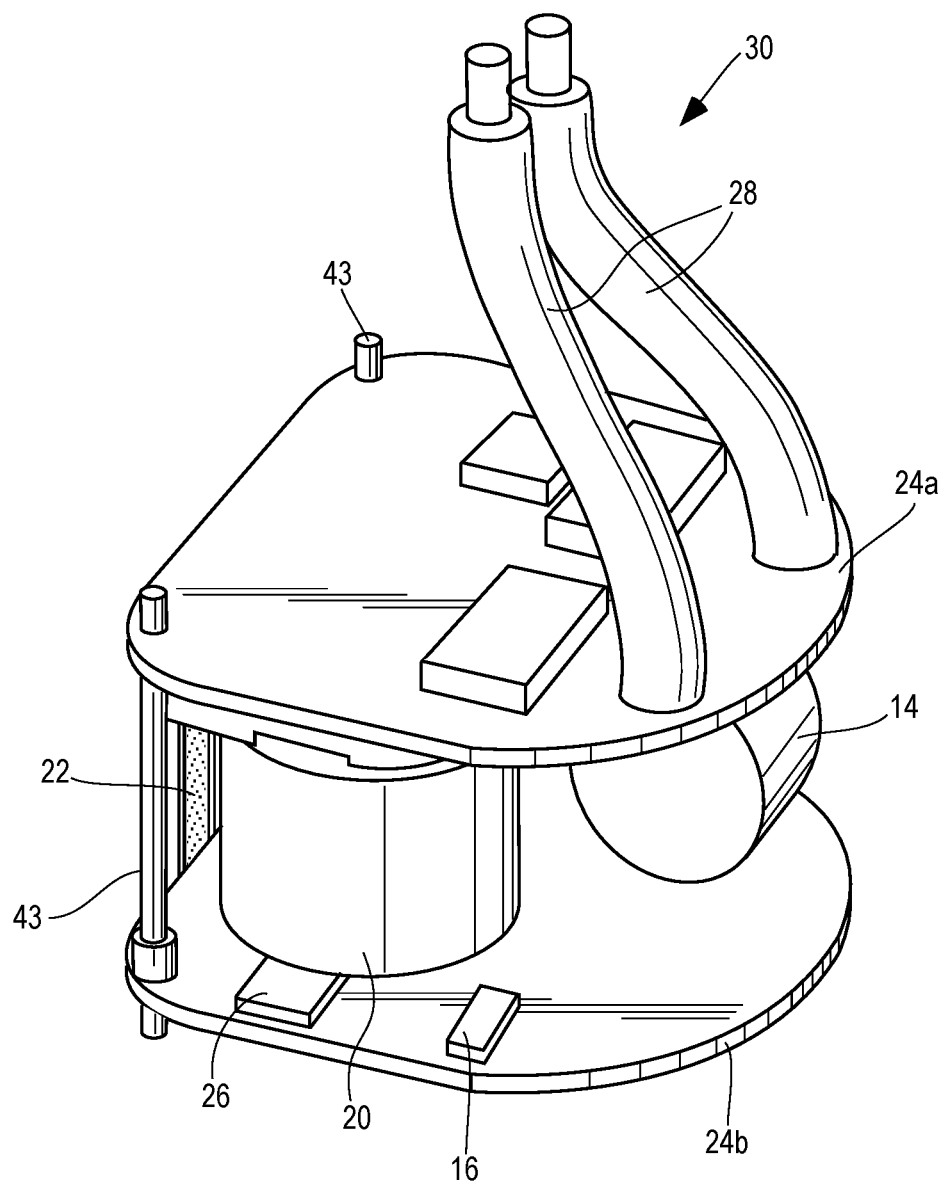
FIG. 4 is a perspective view of the printed circuit board of FIG. 2 in a folded configuration.

The format of the printed circuit board 30 allows for a more compact configuration. Specifically, FIG. 4 shows how the rigid boards 24a,b may be oriented perpendicularly to the flexible rigid board connector 22, resulting in the printed circuit board 30 of FIG. 2 being folded into a sandwich-like configuration. The printed circuit board 10 of FIG. 1 has a footprint of 1.5 inches×1.5 inches in area; however, the folded printed circuit board 30 with the same functionality or more could occupy a footprint of approximately 1 inch×1 inch area, i.e., only two-thirds the area of the printed circuit board 10. The folded circuit board 30 also could have an approximate height of 1 inch, thus giving it roughly one cubic inch in volume. While the height of printed circuit board 30 is greater than the height of printed circuit board 10, the height difference is marginal compared to the savings in footprint size. In some cases, there is height space available in the application, whereas the footprint space is limited. As will be discussed below, this compact cubic size accommodates the size limitations associated with integration of printed circuit boards with a solenoid used with a valve.

Figure 5:
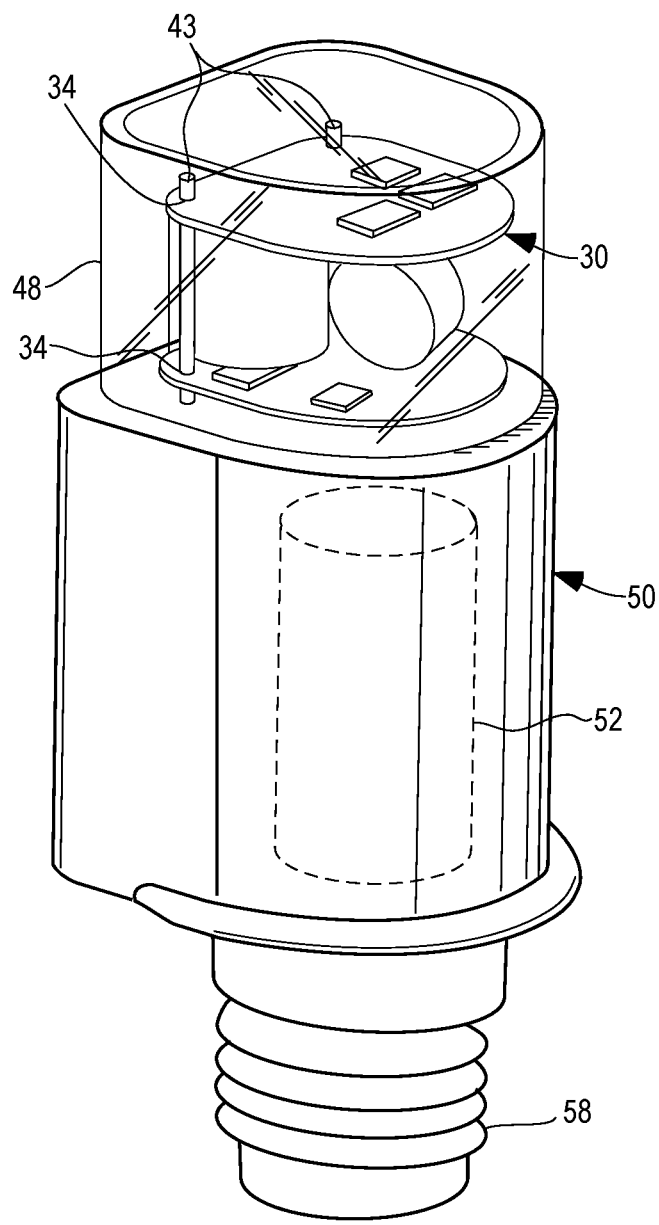
FIG. 5 is a perspective view of the printed circuit board of FIG. 4 housed in an enclosure associated with a solenoid enclosure.

With reference to FIG. 5, the compact printed circuit board 30 is enclosed in a housing 48. The housing 48 may be made of rigid material, such as plastic and may sit atop a solenoid enclosure 50 containing a solenoid 52. The pins 43 are mounted to extend from board 24b with a short extension in one direction and a larger extension in the other direction. The large extensions are inserted through the holes 34 in the printed circuit board 24a and are soldered to maintain the folded configuration. The shorter extensions are fitted into holes in the top of the solenoid enclosure 50. The base of the housing 48 is attached to the top of the solenoid enclosure 50 with an adhesive, such as epoxy. In this way, the micro-electronics (e.g., the signal conditioning circuits 16, the micro-controller 40, the voltage regulator 42, etc.) can be integrated with the solenoid enclosure 50 in a relatively small configuration that does not expand the transverse dimension of the combined unit. The resulting compact design of the printed circuit board 30 coupled to the solenoid 52 makes for easier installation and maintenance in the field.

The pins 43 can be used to determine the spacing between the printed circuit boards 24a,b. For example, the pins 43 and the flexible rigid board connector 22 can be longer to space the printed circuit boards 24a,b farther apart. Also, the stacked configuration of the printed circuit boards 24a,b provide options on locating components. For instance, if it is preferred to separate certain components, then one component could be mounted on the top of the upper printed circuit board 24a and the other component can be mounted on the bottom of the lower printed circuit board 24b.

Figure 6:
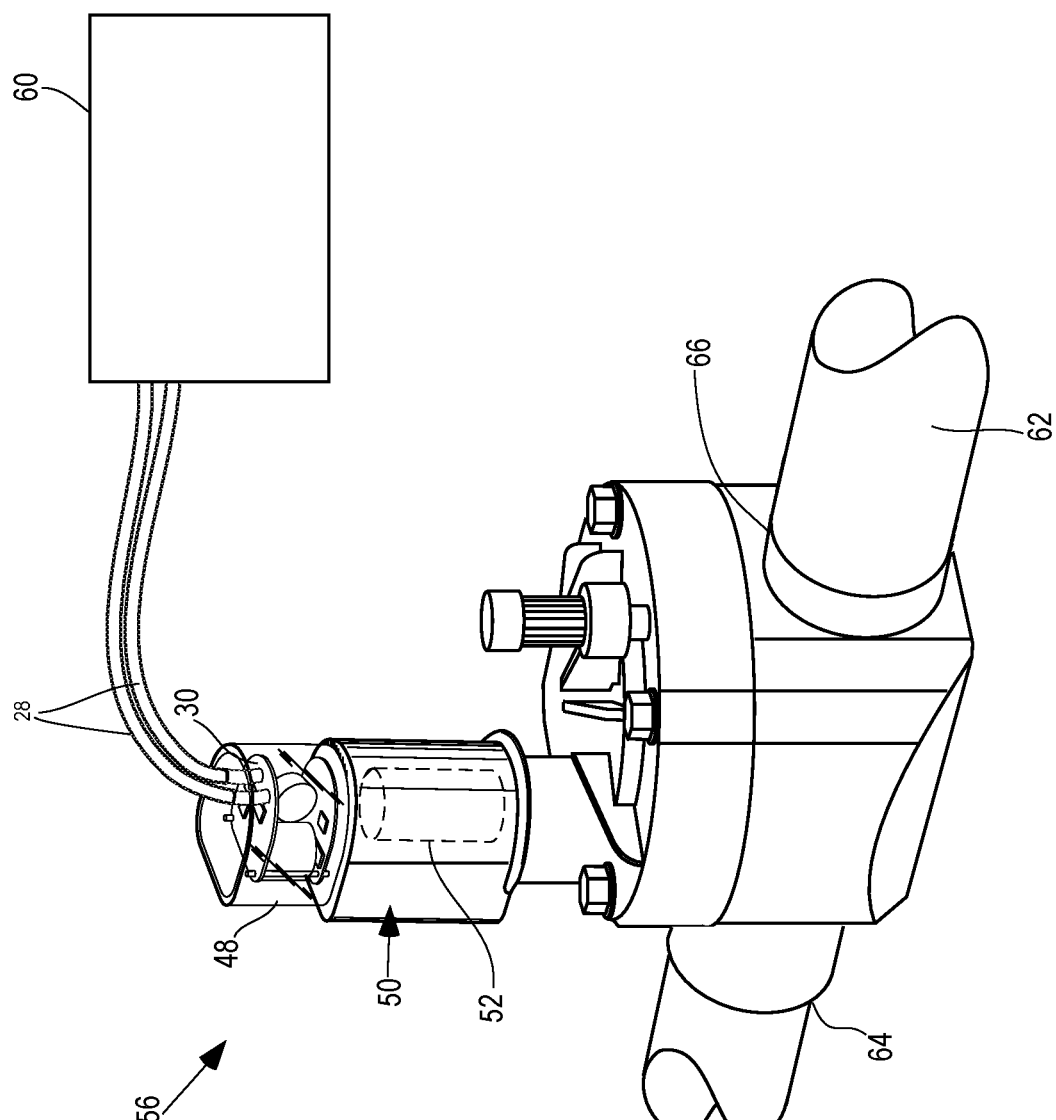
FIG. 6 is a perspective view of an irrigation valve and a solenoid using the printed circuit board of FIG. 4.

Referring to FIG. 6, an example of a valve 56 in an irrigation system is shown. The solenoid enclosure 50 and the integrated printed circuit board 30 are directly attached to the valve 56 via a threaded stem 58 (FIG. 5) at the base of the solenoid enclosure 50. Irrigation pipes 62 are secured to an inlet 64 and an outlet 66 of the valve 56. A controller 60 controls when to allow flow to run through the pipe 62 downstream of the valve 56. The wiring 28 couples the controller 60 to the solenoid of the valve 56. The controller 60 includes schedules that turn on and off the valves via the solenoids for controlling irrigation. The wiring 28 alternatively can be connected to the printed circuit board 30. This enables the printed circuit board 30 to analyze information or data being sent in analog form through the wires 28. This data can include whether or not a particular signal is for one solenoid or a different solenoid. This allows valves to be electrically connected in series as opposed to having independent wire runs. This also can be used with sprinklers having built-in valves controlled by solenoids.

Figure 7:
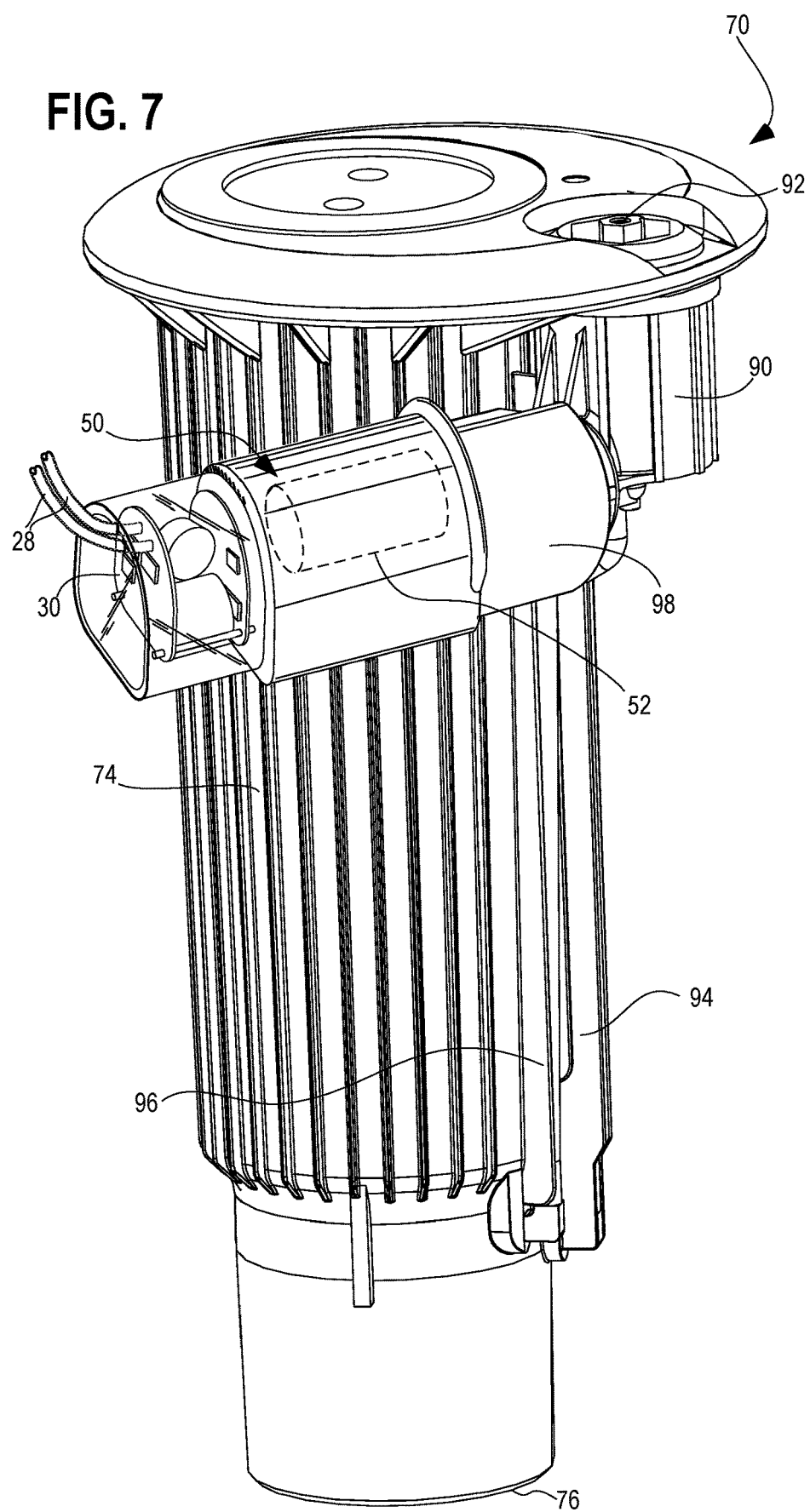
FIG. 7 is a perspective view of a sprinkler and a solenoid using the printed circuit board of FIG. 4.
Figure 8:
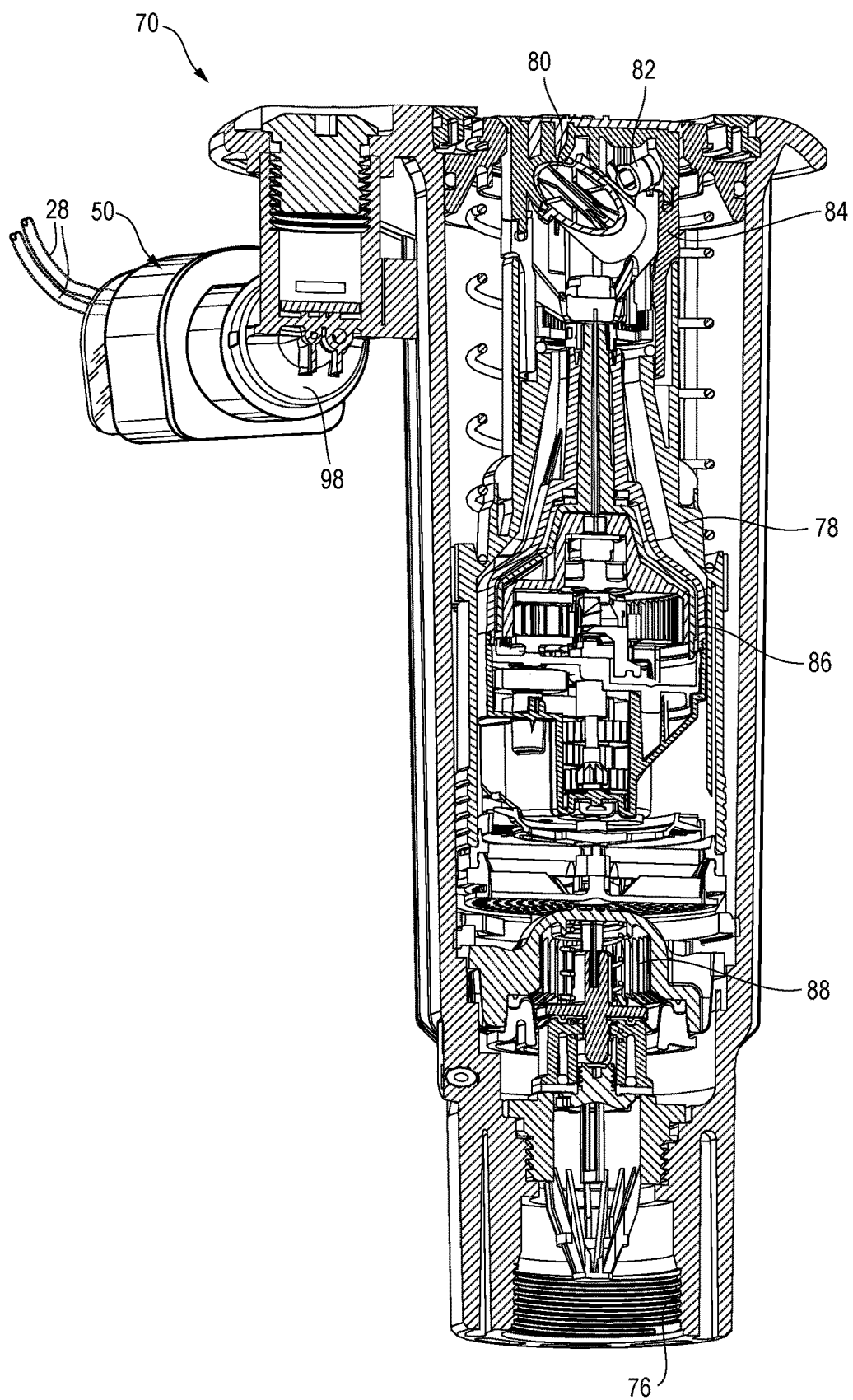
FIG. 8 is a cross-sectional view of FIG. 7.

Referring to FIGS. 7 and 8, there is shown an irrigation sprinkler in the form of a pop-up rotor sprinkler 70. The sprinkler 70 includes a stationary housing 74 with an inlet 76 configured to connect to a fluid supply line (not shown). The sprinkler 70 further includes a riser 78 that extends from the housing 74 during irrigation operations. The terminal end of the riser 78 includes at least one nozzle 80. A second nozzle 82 also may be included and designed for short distance range, while the nozzle 80 would be designed for longer range. The nozzles 80, 82 are mounted in a rotating turret 84 that is rotated by a fluid driven rotor mechanism 86 to cause the nozzles 80, 82 to rotate while distributing water from the sprinkler 70 via the nozzles 80, 82. Although the following is described in connection with a rotor type irrigation sprinkler, the following disclosure can be applicable to other irrigation devices where pressure control in desired, such as, for example, impact sprinklers, spray heads, drip irrigation devices and lines, valves, etc.

An inlet control valve 88 is disposed in the housing 74 adjacent the inlet 76 to allow irrigation and to compensate for changes in flow rates and water pressure from the supply line. The sprinkler 70 also includes a pressure regulating system 90 that monitors the fluid pressure in the housing 74 and controls the inlet control valve 88 based on such monitoring. The pressure regulating system 90 provides a three-position valve (ON-OFF-AUTO) 92, and a mount 98 for the solenoid 52 all in a single component. The ON position bypasses the solenoid 52, the OFF position disables the sprinkler 70, and the AUTO position is controlled by the solenoid 52. A housing supply line 94 provides water from the housing 74 to the pressure regulating system 90, and a housing return line 96 provides water from the pressure regulating system 90 back to the housing 74.

As illustrated, the solenoid enclosure 50 and the integrated printed circuit board 30 are directly attached to the sprinkler 70 with the threaded stem 58 onto the solenoid mount 98 of the pressure regulating system 90. The solenoid mount 98 has interior threads for receiving the threaded stem 58. In a manner similar to the example of FIG. 6, the controller 60 sends on/off analog signals over the wires 28, the wires 28 being connected to the printed circuit board 30. The printed circuit board 30 is electrically coupled to the solenoid 52 and, upon analyzing the on/off signal, the printed circuit board 30 sends an electromagnetic signal to a coil housed in the solenoid 52 when the three-position valve 92 is set to the AUTO position. The coil develops an electromagnetic flux sufficient to cause actuation of the valve in the sprinkler 70, the actuation being to either open or close the valve based upon the analog signal sent from the controller 60. The data can include whether or not a particular signal is for one solenoid or a different solenoid, allowing sprinklers to be electrically connected in series as opposed to having independent wire runs. The printed circuit board 30 could include a receiver or transceiver to receive control signals wirelessly from the controller 60 and to feedback information to the controller.

In some examples, solenoid enclosures may already be attached to valves or sprinklers in the field. The folded circuit boards and their housing may simply be attached and wired to the existing solenoid enclosure and re-threaded onto the valve. Alternatively, the current solenoid could be replaced with a solenoid having the folded circuit board 30 already associated with it in separate enclosure or a single-piece enclosure.

With the separate enclosure for the printed circuit boards, the circuitry is separated from the solenoid, and is less susceptible to thermal transfer from the solenoid which can degrade the circuitry, thereby extending the lifetime of the printed circuit board. Additionally, the solenoid enclosure and the housing may be potted with separate materials to further reduce heat transfer from the solenoid to the printed circuit board. Alternatively, an extended solenoid enclosure can be used with one compartment for the solenoid components and a second compartment for the folded printed circuit board. This single piece enclosure with the separate components can still permit the use of separate/different potting materials.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the technological contribution. The actual scope of the protection sought is intended to be defined in the following claims.

What is claimed is:

1. A solenoid for controlling a valve comprising: a solenoid housing having a longitudinal axis and a maximum dimension transverse to the longitudinal axis and having a portion that connects to a valve body of the valve for controlling the valve; a coil disposed in the solenoid housing; at least two rigid printed circuit boards; a flexible connector extending between the at least two rigid printed circuit boards, the flexible connector configuring the at least two rigid circuit boards to overlie one another; micro-electronics on at least one side of each of the at least two rigid printed circuit boards: an electrical connection between the at least two rigid printed circuit boards and the coil; and the at least two rigid printed circuit boards extending transverse to the longitudinal axis and not extending beyond the maximum dimension transverse to the longitudinal axis when configured to overlie one another.

2. The solenoid of claim 1 further comprising a coupling to maintain the at least two rigid printed circuit boards in their overlying configuration to one another.

3. The solenoid of claim 2 wherein a length of the coupling affects the spacing between the at least two rigid printed circuit boards.

4. The solenoid of claim 1 further comprising a printed circuit board housing for the at least two rigid printed circuit boards and the flexible connector.

5. The solenoid of claim 4 wherein a base of the printed circuit board housing is attached to the housing.

6. The solenoid of claim 5 wherein the printed circuit board housing and housing are attached with an adhesive.

7. The solenoid of claim 5 wherein the printed circuit board housing and the housing include a potting material.

8. The solenoid of claim 7 wherein the potting material includes a first potting material for the printed circuit board housing and a second potting material for the housing.

9. The solenoid of claim 1 further comprising an enclosure for the coil and wherein at least one of the at least two rigid printed circuit boards is soldered to the enclosure.

10. The solenoid of claim 1 wherein the micro-electronics include components configured for signal decoding.

11. The solenoid of claim 1 wherein the micro-electronics include a transceiver.

12. The solenoid of claim 1 wherein the micro-electronics include a sensor.

13. The solenoid of claim 1 wherein the at least two rigid printed circuit boards are disposed in the solenoid housing when configured to overlie one another.

14. The solenoid of claim 13 wherein the solenoid housing includes two types of potting material, one type of potting material potting the coil and the other type of potting material potting the at least two rigid printed circuit boards.

15. A valve comprising:
   an inlet, an outlet and a valve seat in between the inlet and the outlet;
   a valve member engageable with the valve seat to close the valve and moveable away from the valve seat to control flow through the valve;
   a pressure chamber controlling the position of the valve member; and
   a solenoid communicating with the with the pressure chamber to change the pressure in the pressure chamber, the solenoid comprising,
   a solenoid housing having a longitudinal axis and a maximum dimension transverse to the longitudinal axis and removably connected to the valve;
   a coil disposed in the solenoid housing,
   at least two rigid printed circuit boards, a flexible connector extending between the at least two rigid printed circuit boards, the flexible connector configuring the at least two rigid circuit boards to overlie one another, micro-electronics on at least one side of each of the at least two rigid printed circuit boards;

an electrical connection between the at least two rigid printed circuit boards and the coil; and the at least two rigid printed circuit boards extending transverse to the longitudinal axis and not extending beyond the maximum dimension transverse to the longitudinal axis when configured to overlie one another.

16. The valve of claim 15 further comprising a coupling to maintain the at least two rigid printed circuit boards in their overlying configuration to one another.

17. The valve of claim 15 further comprising a printed circuit board housing for the at least two rigid printed circuit boards and the flexible connector.

18. The valve of claim 17 wherein the printed circuit board housing is attached to the housing.

19. The valve of claim 18 wherein the printed circuit board housing and the housing include a potting material.

20. The valve of claim 19 wherein the potting material includes a first potting material for the printed circuit board housing and a second potting material for the housing.

21. The valve of claim 15 wherein the micro-electronics include components configured for signal decoding.

22. The valve of claim 15 wherein the at least two rigid printed circuit boards are disposed in the solenoid housing when configured to overlie one another.

23. The valve of claim 22 wherein the solenoid housing includes two types of potting material, one type of potting material potting the coil and the other type of potting material potting the at least two rigid printed circuit boards.

24. A sprinkler comprising:
a discharge port for discharging water for irrigating;
a housing defining an inlet;
a control valve downstream of the inlet to control flow through the housing, the control valve comprising,
  an inlet, an outlet and a valve seat in between the inlet and the outlet,
  a valve member engageable with the valve seat to close the valve and moveable away from the valve seat to control flow through the valve, and
  a pressure chamber controlling the position of the valve member;
a solenoid communicating with the with the pressure chamber to change the pressure in the pressure chamber, the solenoid comprising,
  a coil housing having a longitudinal axis and a maximum dimension transverse to the longitudinal axis and the coil housing removably connected to the housing;
  a coil disposed in the coil housing,
  at least two rigid printed circuit boards,
  a flexible connector extending between the at least two rigid printed circuit boards, the flexible connector configuring the at least two rigid circuit boards to overlie one another,
  micro-electronics on at least one side of each of the at least two rigid printed circuit boards;
an electrical connection between the at least two rigid printed circuit boards and the coil; and
the at least two rigid printed circuit boards extending transverse to the longitudinal axis and not extending beyond the maximum dimension transverse to the longitudinal axis when configured to overlie one another.

25. The sprinkler of claim 24 further comprising a coupling to maintain the at least two rigid printed circuit boards in their overlying configuration to one another.

26. The sprinkler of claim 24 further comprising a printed circuit board housing for the at least two rigid printed circuit boards and the flexible connector.

27. The sprinkler of claim 26 wherein the printed circuit board housing is attached to the coil housing.

28. The sprinkler of claim 27 wherein the printed circuit board housing and the coil housing include a potting material.

29. The sprinkler of claim 28 wherein the potting material includes a first potting material for the printed circuit board housing and a second potting material for the coil housing.

30. The sprinkler of claim 24 wherein the micro-electronics include components configured for signal decoding.

31. The sprinkler of claim 24 wherein the at least two rigid printed circuit boards are disposed in the coil housing when configured to overlie one another.

32. The solenoid of claim 31 wherein the coil housing includes two types of potting material, one type of potting material potting the coil and the other type of potting material potting the at least two rigid printed circuit boards.

* * * * *

UNITED STATES PATENT AND TRADEMARK OFFICE
CERTIFICATE OF CORRECTION

PATENT NO. : 10,980,120 B2  
APPLICATION NO. : 16/007007  
DATED : April 13, 2021  
INVENTOR(S) : Chong Wang Kwak and John James Wlassich It is certified that error appears in the above-identified patent and that said Letters Patent is hereby corrected as shown below:

In the Claims

Column 6, Line 12, in Claim 1, delete "boards:" and insert --boards;-- therefor.

Column 6, Line 60, in Claim 15, delete "with the with the" and insert --with the-- therefor.

Column 8, Line 1, in Claim 24, delete "with the with the" and insert --with the-- therefor.

Column 8, Line 42, in Claim 32, delete "solenoid" and insert --sprinkler-- therefor.

Signed and Sealed this  
Thirteenth Day of July, 2021

Drew Hirshfeld  
*Performing the Functions and Duties of the*  
*Under Secretary of Commerce for Intellectual Property and*  
*Director of the United States Patent and Trademark Office*